United States Patent
Hsieh et al.

(10) Patent No.: US 10,280,260 B2
(45) Date of Patent: May 7, 2019

(54) PHOSPHORUS-CONTAINING POLYPHENYLENE OXIDE RESIN, ITS PREPARATION METHOD, METHOD FOR PREPARING PREPOLYMER OF PHOSPHORUS-CONTAINING POLYPHENYLENE OXIDE, RESIN COMPOSITION AND ITS APPLICATION

(71) Applicant: Elite Material Co., Ltd., Taoyuan (TW)

(72) Inventors: Chen-Yu Hsieh, Taoyuan (TW); Tse-An Lee, Taoyuan (TW); Hui-Ting Shih, Taoyuan (TW)

(73) Assignee: ELITE MATERIAL CO., LTD., Taoyuan (TW)

( * ) Notice: Subject to any disclaimer, the term of this patent is extended or adjusted under 35 U.S.C. 154(b) by 147 days.

(21) Appl. No.: 15/224,773

(22) Filed: Aug. 1, 2016

(65) Prior Publication Data

US 2017/0088669 A1    Mar. 30, 2017

(30) Foreign Application Priority Data

Sep. 25, 2015    (TW) .............................. 104131810 A

(51) Int. Cl.
 *C08J 5/24* (2006.01)
 *C08K 3/36* (2006.01)
 (Continued)

(52) U.S. Cl.
 CPC .............. *C08G 65/485* (2013.01); *C08J 5/24* (2013.01); *C08K 3/36* (2013.01); *C08K 5/14* (2013.01);
 (Continued)

(58) Field of Classification Search
 CPC ....... C08G 65/485; C08J 5/24; C08J 2371/12; C08J 2379/00; C08J 2471/12; C08K 3/36;
 (Continued)

(56) References Cited

FOREIGN PATENT DOCUMENTS

| CN | 1002850766 | * | 1/2013 |
|---|---|---|---|
| CN | 103059793 A | | 4/2013 |

(Continued)

*Primary Examiner* — Kelechi C Egwim
(74) *Attorney, Agent, or Firm* — Bacon & Thomas, PLLC

(57) ABSTRACT

The present invention relates to a phosphorus-containing polyphenylene oxide resin, its preparation method, a method for preparing the prepolymer of the phosphorus-containing polyphenylene oxide, a resin composition and an article thereof, wherein the phosphorus-containing polyphenylene oxide resin has a chemical structure represented by the following formula (I):

formula (I)

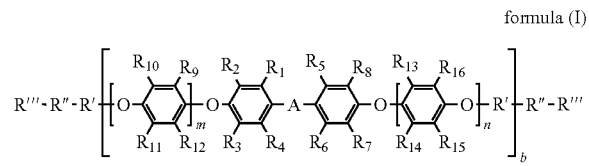

wherein R' is

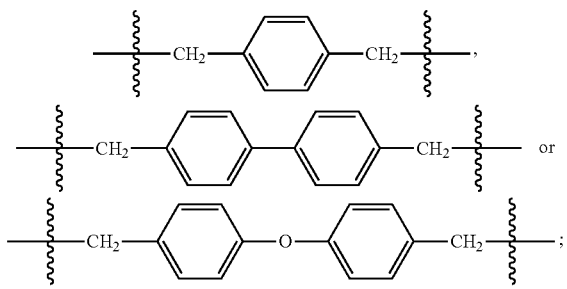

R" is

R'" is hydrogen, (Continued)

Through the use of the above phosphorus-containing polyphenylene oxide resin, an article made from the resin composition can has good flame retardance, good thermal resistance and a lower percent of thermal expansion while dielectric properties can be maintained, such that the present invention is suitable for use in products such as copper clad laminate and printed circuit board.

13 Claims, 3 Drawing Sheets

(51) Int. Cl.
| | |
|---|---|
| *C08K 5/14* | (2006.01) |
| *C08L 73/00* | (2006.01) |
| *C09D 179/00* | (2006.01) |
| *C08G 65/48* | (2006.01) |
| *C08K 5/3415* | (2006.01) |
| *C08K 5/5399* | (2006.01) |
| *H05K 1/03* | (2006.01) |

(52) U.S. Cl.
CPC .......... *C08K 5/3415* (2013.01); *C08K 5/5399* (2013.01); *C08L 73/00* (2013.01); *C09D 179/00* (2013.01); *H05K 1/0373* (2013.01); *C08J 2371/12* (2013.01); *C08J 2379/00* (2013.01); *C08J 2471/12* (2013.01); *H05K 2201/012* (2013.01)

(58) Field of Classification Search
CPC ...... C08K 5/14; C08K 5/3415; C08K 5/5399; C08L 73/00; C09D 179/00; H05K 1/0373; H05K 2201/012
USPC .......................................................... 524/540
See application file for complete search history.

(56) References Cited

FOREIGN PATENT DOCUMENTS

| | | | |
|---|---|---|---|
| CN | 103113711 A | | 5/2013 |
| CN | 104177809 A | | 12/2014 |
| CN | 104629341 A | | 5/2015 |
| CN | 104774476 A | | 7/2015 |
| JP | 20122119461 | * | 6/2012 |
| JP | 2014101491 A | | 6/2014 |
| TW | 201524989 A | | 7/2015 |

* cited by examiner

PHOSPHORUS-CONTAINING POLYPHENYLENE OXIDE RESIN, ITS PREPARATION METHOD, METHOD FOR PREPARING PREPOLYMER OF PHOSPHORUS-CONTAINING POLYPHENYLENE OXIDE, RESIN COMPOSITION AND ITS APPLICATION

FIELD OF THE INVENTION

The present invention relates to a polyphenylene oxide resin, especially to a phosphorus-containing polyphenylene oxide resin suitable for use in electronic products. The present invention also relates to a method for preparing the phosphorus-containing polyphenylene oxide resin and the prepolymer of the phosphorus-containing polyphenylene oxide, a resin composition comprising the same and a resin article.

BACKGROUND OF THE INVENTION

With the rapid development of electronic technology, information processing for electronic products, such as mobile communication, servers and cloud storage, has been continuously developing towards the high-frequency signal transmission and high-speed digitizing. Low dielectric resin materials are thus the main developing direction for current high frequency and high transmission rate laminates, so as to satisfy the requirement of high speed information transmission. For copper clad laminates, materials must have a low dielectric constant (Dk), a low dissipation factor (Df), high reliability, high humidity resistance and high thermal resistance and high dimensional stability. Thus, the development of a high performance printed circuit board (PCB) is the direction that the industry is actively developing.

Compared with other resin materials, polypheylene ether resin (PPE resin or polyphenylene oxide resin (PPO resin)) has a relatively low dielectric constant and a low dissipation factor, and in turn has turned to an ideal material for current high frequency printed circuit boards.

However, the flame retardance and thermal resistance of current polyphenylene oxide (such as dihydroxyl polyphenylene oxide or bis(vinylbenzyl) polyphenylene oxide) are insufficient and the dielectric constant and dissipation factor need to reach required target values.

To overcome the above problems, in current technology, a flame retardant, such as a phosphorus-containing compound, is added to a resin composition containing polyphenylene oxide, so as to improve the flame retardance property of conventional polyphenylene oxide. However, the flame retardant not only deteriorates dielectric properties, but also reduces the thermal resistance of a polyphenylene oxide article. Thus, current polyphenylene oxide articles cannot have the required flame retardance, thermal resistance and dielectric properties.

BRIEF SUMMARY OF THE INVENTION

To overcome the technical defects of current technology, the purpose of the present invention is to improve the properties of current polyphenylene oxide resin used in a copper clad laminate, such that the copper clad laminate can have better flame retardance and thermal resistance while an almost the same dissipation factor can be maintained.

Another purpose of the present invention is to improve the problem of overly high percent of thermal expansion when current polyphenylene oxide resin is used in a copper clad laminate.

To achieve the above purpose, the present invention provides a phosphorus-containing polyphenylene oxide resin comprising a chemical structure represented by the following formula (I):

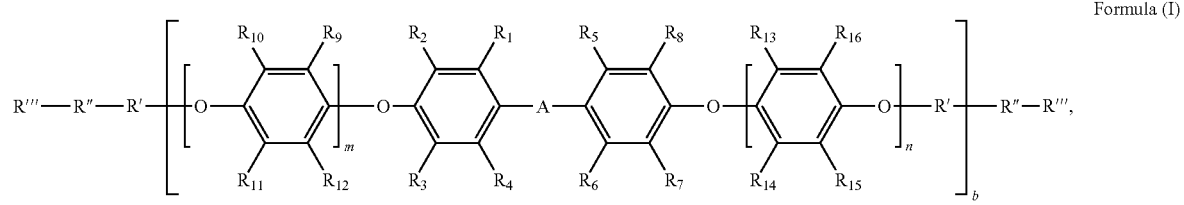

Formula (I)

wherein A is selected from a covalent bond, —$CH_2$—, —$CH(CH_3)$—, —$C(CH_3)_2$—, —O—, —S—, —$SO_2$— and carbonyl(—CO—);

b is a positive integer of 1 to 20;

each of m and n independently represents a positive integer of 1 to 30;

R' is

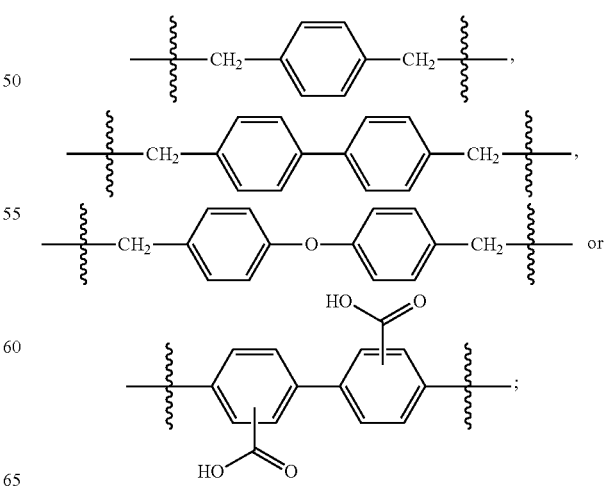

R″ is

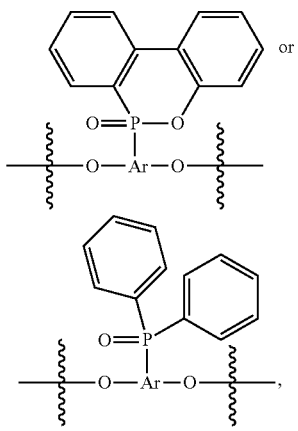

wherein Ar is phenylene, naphthylene or biphenylene, and the —O— can be connected to any carbon atom on Ar; R‴ is hydrogen,

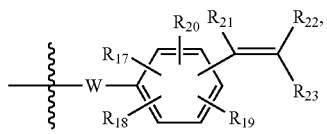

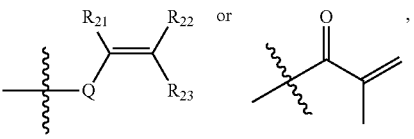

and each of Q and W independently represents an aliphatic group; and
each of $R_1$ to $R_{23}$ independently represents hydrogen (—H), methyl (—CH$_3$) or halogen (such as —Cl, —Br or —I).

Preferably, b is a positive integer of 1 to 5; and more preferably, b is 1.

The above m and n can be the same or different positive integers. Preferably, each of m and n can independently be a positive integer of 1 to 10; and more preferably, each of m and n can independently be a positive integer of 1 to 6.

Preferably, for the above $R_1$ to $R_{16}$, $R_2$, $R_3$, $R_7$, $R_8$, $R_{10}$, $R_{11}$, $R_{15}$ and $R_{16}$ are —CH$_3$; $R_1$, $R_4$, $R_5$, $R_6$, $R_9$, $R_{12}$, $R_{13}$ and $R_{14}$ are hydrogen; and A is —C(CH$_3$)$_2$—. Alternatively, $R_1$, $R_2$, $R_3$, $R_6$, $R_7$, $R_8$, $R_{10}$, $R_{11}$, $R_{15}$ and $R_{16}$ are —CH$_3$; $R_4$, $R_5$, $R_9$, $R_{12}$, $R_{13}$ and $R_{14}$ are hydrogen; and A is a covalent bond.

In a preferable embodiment, the phosphorus-containing polyphenylene oxide resin of the present invention has a chemical structure represented by the following formula (II):

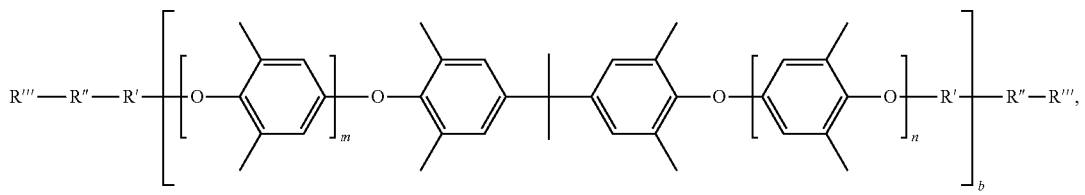

Formula (II)

wherein the definitions for R′, R″, R‴, m, n and b can be the same as those described in the above.

In another preferable embodiment, the phosphorus-containing polyphenylene oxide resin of the present invention has a chemical structure represented by the following formula (III):

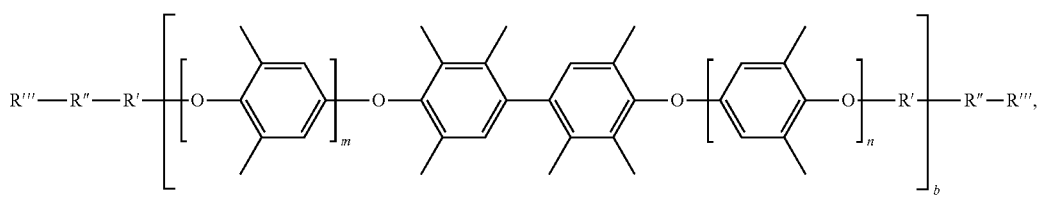

Formula (III)

wherein R', R", R''', m, n and b can be the same as those described in the above.

Preferably, R" is

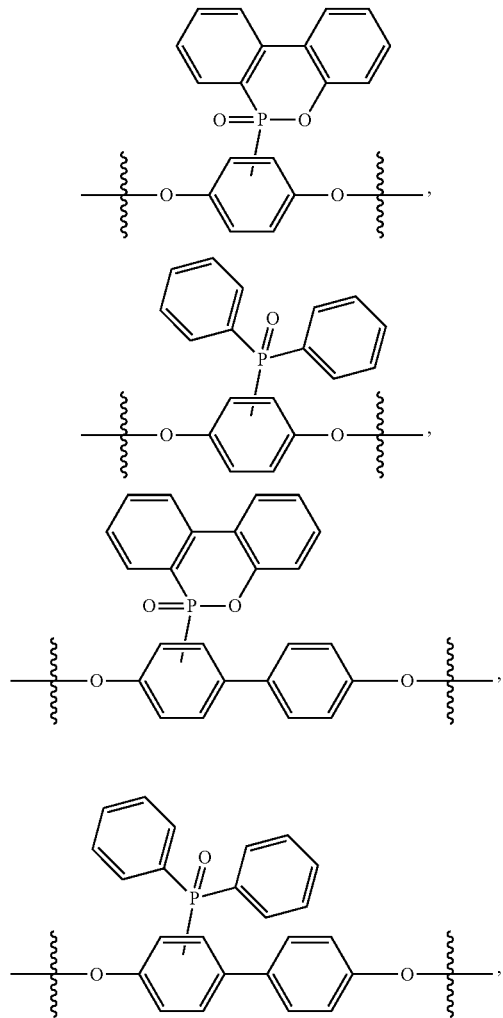

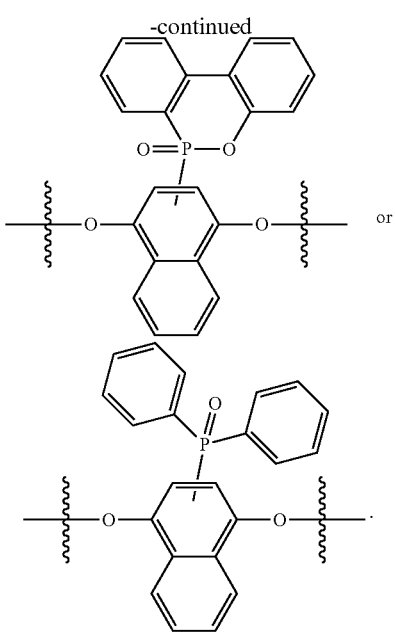

Preferably, the above R''' is hydrogen.

Preferably, the above W is an aliphatic group having a carbon number of 1 to 3 (such as $C_1$~$C_3$ alkyl); and more preferably, the above W is —$CH_2$—, $R_{17}$ to $R_{23}$ are all hydrogen. That is, the above R''' is

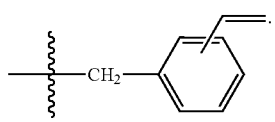

As such, the phosphorus-containing polyphenylene oxide resin can provide better flame retardance and thermal resistance while excellent dielectric properties (i.e., lower dielectric constant and dissipation factor) can be maintained.

Preferably, the above Q is an aliphatic group having a carbon number of 1 to 3 (such as $C_1$~$C_3$ alkyl); and more preferably, the above Q is —$CH_2$—; and $R_{21}$ to $R_{23}$ are all hydrogen. That is, the above R''' is 2-propenyl.

Preferably, the phosphorus-containing polyphenylene oxide resin has a chemical structure represented by any one of the following formula (IV) to Formula (XXX):

Formula (IV)

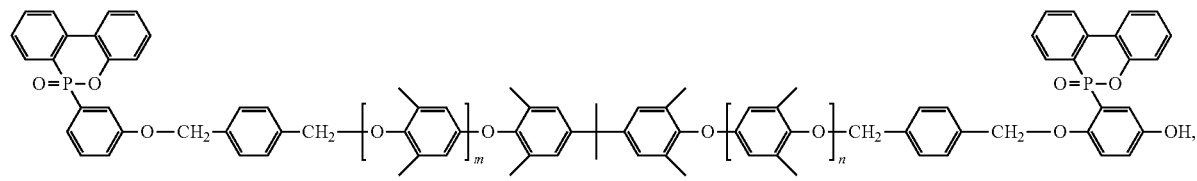

Formula (V)

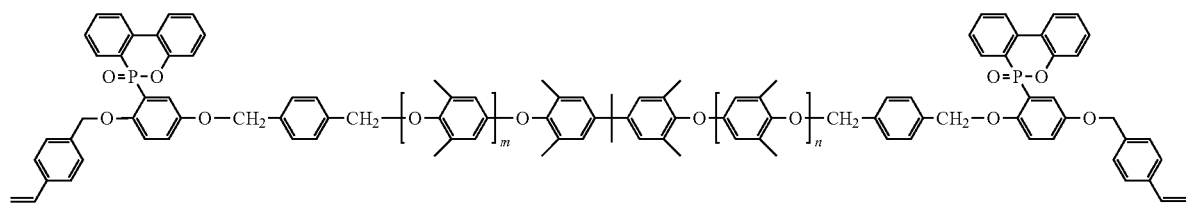

-continued
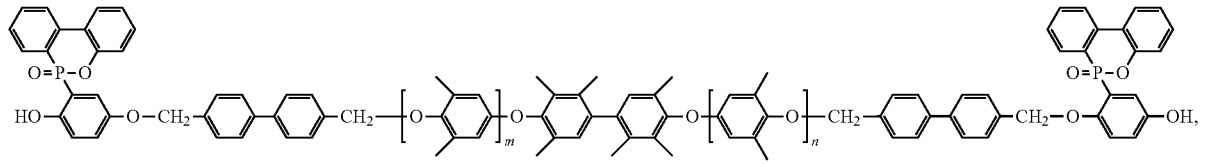
Formula (VI)
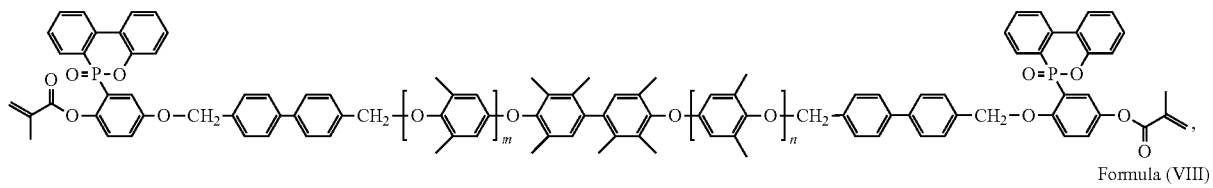
Formula (VII)
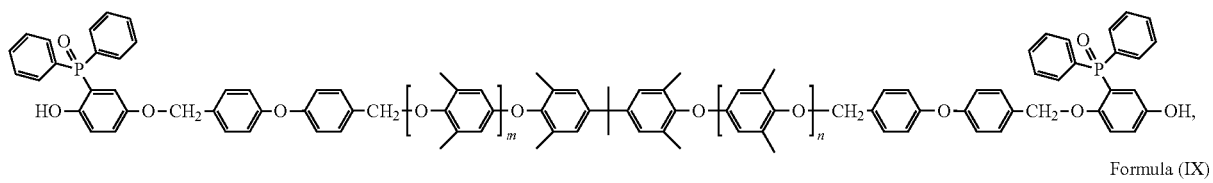
Formula (VIII)
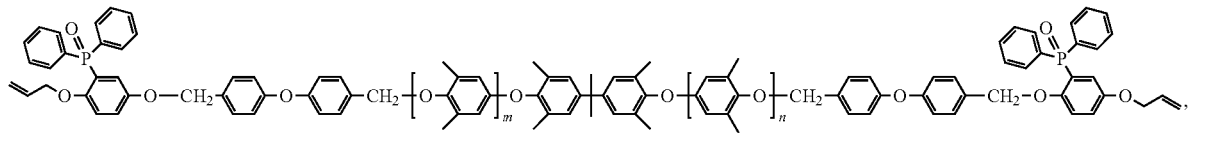
Formula (IX)
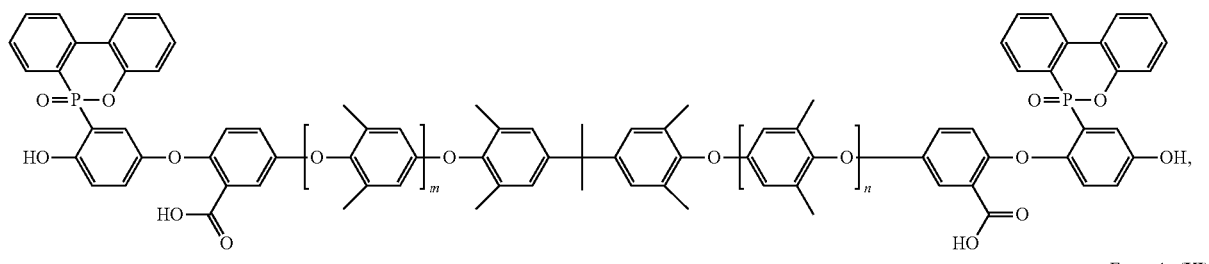
Formula (X)
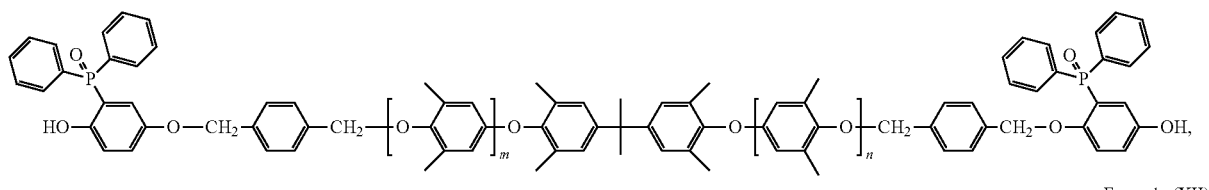
Formula (XI)
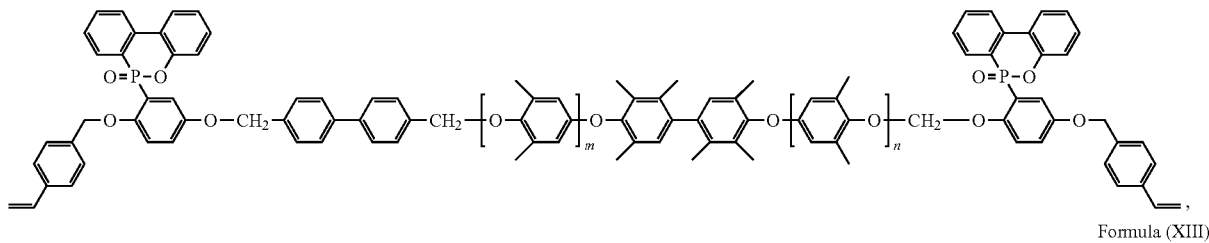
Formula (XII)
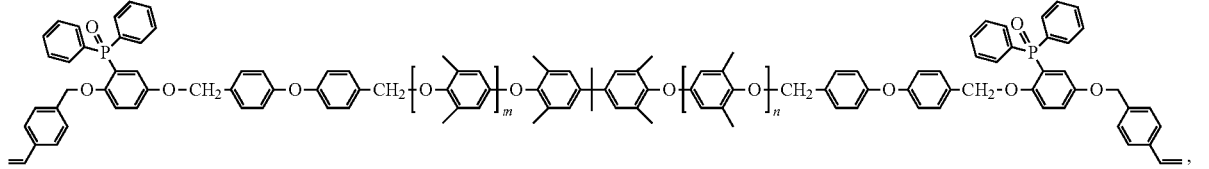
Formula (XIII)

-continued
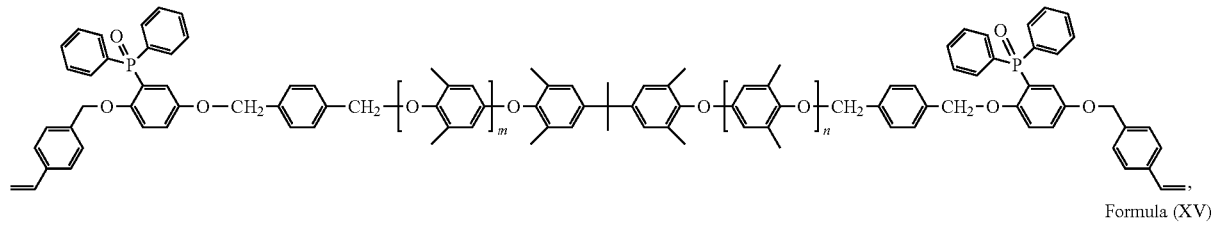
Formula (XIV)
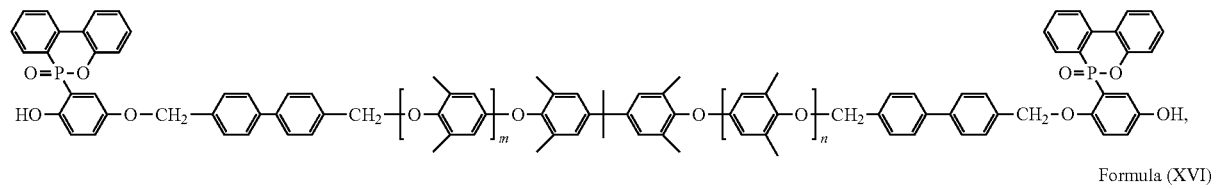
Formula (XV)
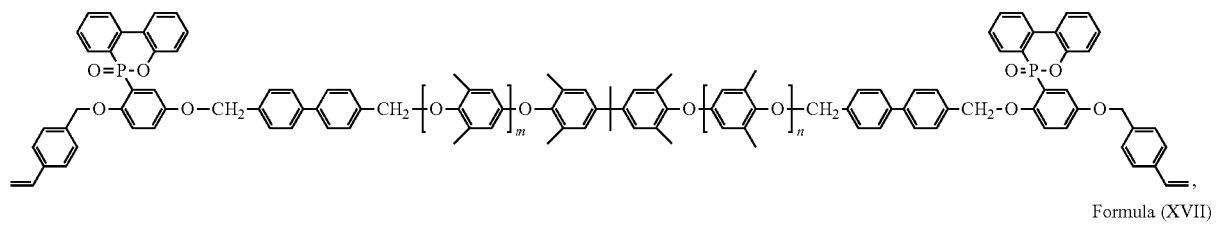
Formula (XVI)
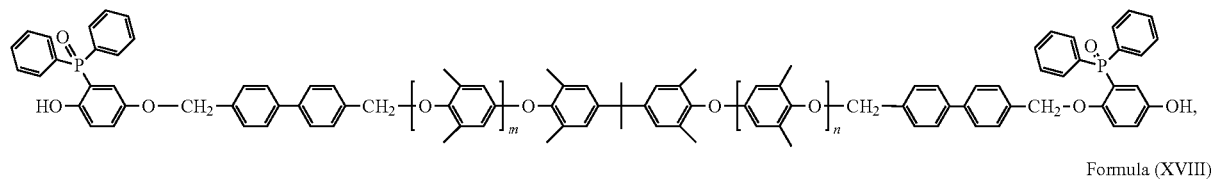
Formula (XVII)
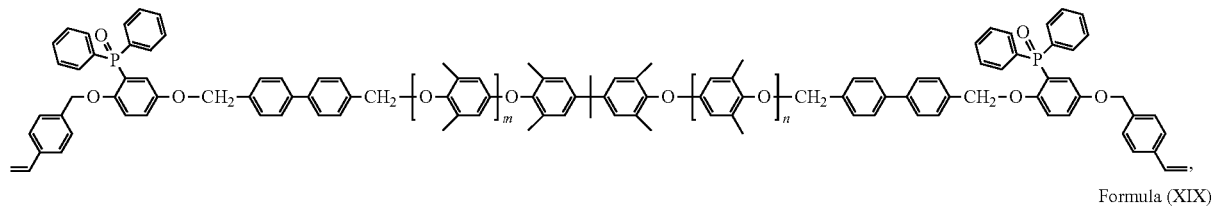
Formula (XVIII)
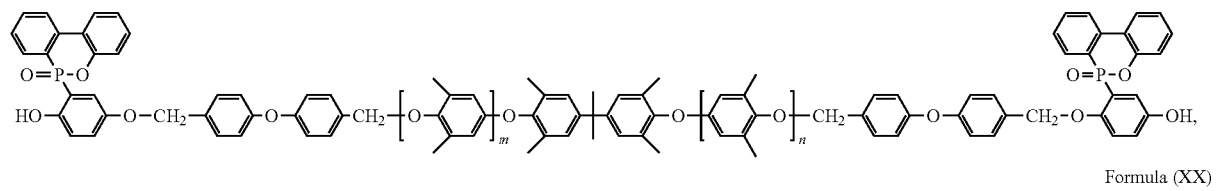
Formula (XIX)
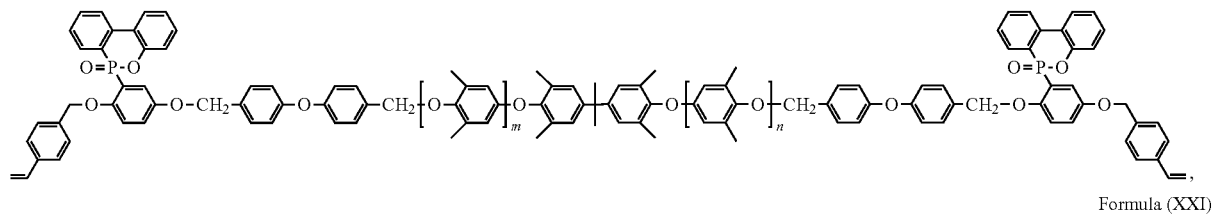
Formula (XX)
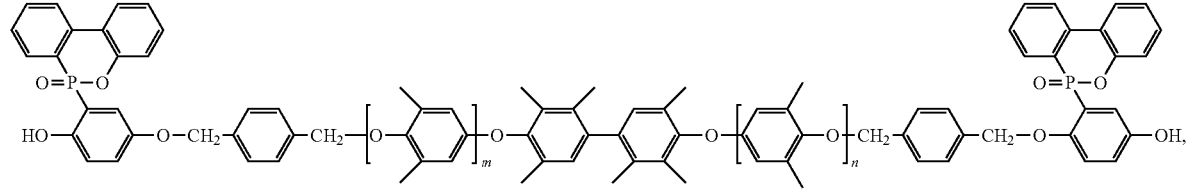
Formula (XXI)

Formula (XXII)
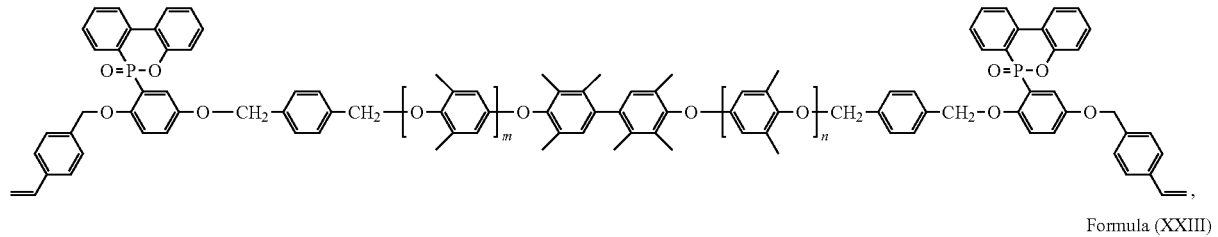
Formula (XXIII)
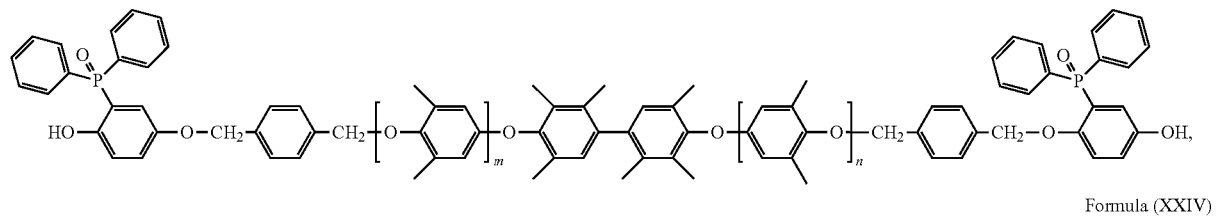
Formula (XXIV)
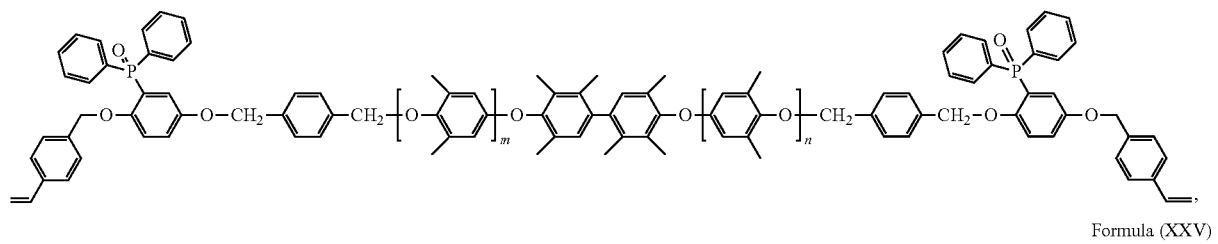
Formula (XXV)
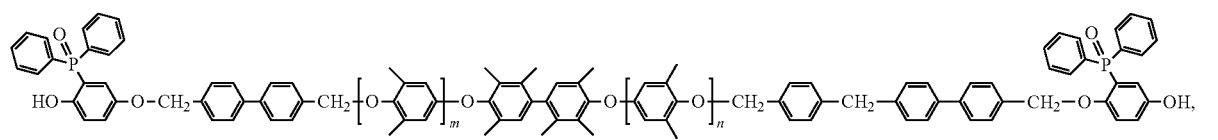
Formula (XXVI)
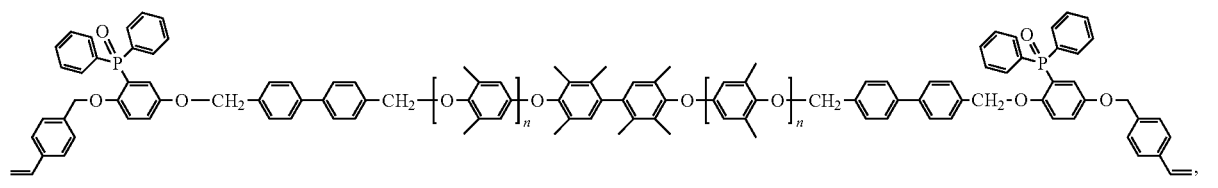
Formula (XXVII)
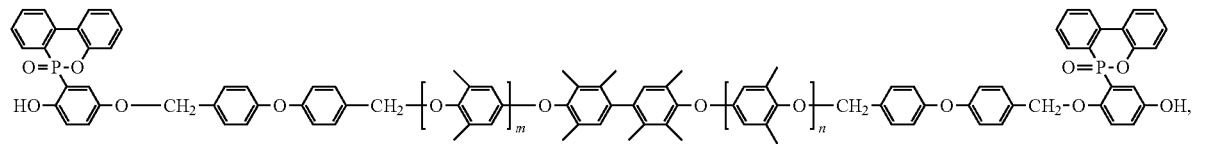
Formula (XXVIII)
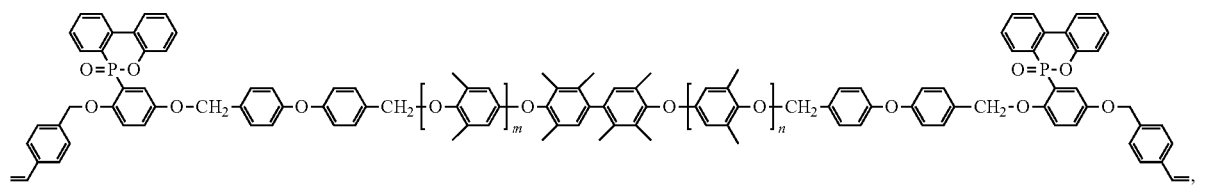
Formula (XXIX)
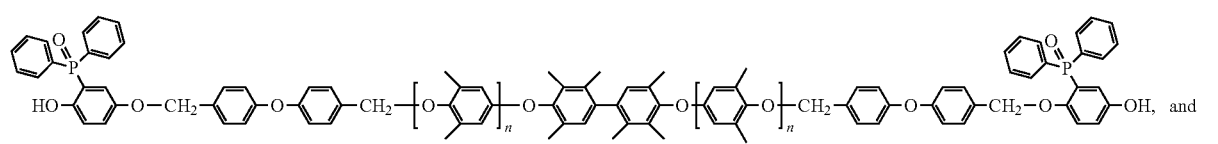

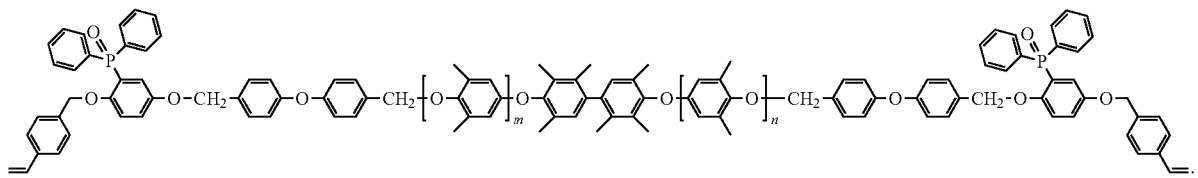

Formula (XXX)

The present invention further provides a method for preparing a phosphorus-containing polyphenylene oxide resin that comprises:

reacting a di(chloromethyl) compound with dihydroxyl polyphenylene oxide, so as to obtain a first intermediate product; and reacting the first intermediate product with the phosphorus-containing compound, so as to obtain the phosphorus-containing polyphenylene oxide resin.

Preferably, in the above step of reacting the di(chloromethyl) compound with dihydroxyl polyphenylene oxide, the method comprises: reacting the di(chloromethyl) compound with dihydroxyl polyphenylene oxide in the presence of a phase transfer catalyst, so as to obtain the first intermediate product.

Preferably, in the above step of reacting the first intermediate product and the phosphorus-containing compound, the method comprises: reacting the first intermediate product with the phosphorus-containing compound in an alkaline environment, so as to obtain the phosphorus-containing polyphenylene oxide resin.

More preferably, the above method comprises:

at a temperature of 60° C. to 90° C., mixing the di(chloromethyl) compound, dihydroxyl polyphenylene oxide, the phase transfer catalyst and a solvent and continuously stirring until a completely dissolved first mixture solution is obtained;

heating the first mixture solution to a temperature of 85° C. to 110° C. and continuously stirring for 4 to 8 hours, so as to obtain a first intermediate product solution;

to the first intermediate product solution, adding alkali metal hydroxide and water, while controlling the temperature between 85° C. and 110° C., and continuously stirring for 4 to 8 hours, so as to obtain an alkaline solution;

cooling the alkaline solution to a temperature of 60° C. to 80° C. to obtain a cooled solution, mixing the phosphorus-containing compound and the cooled solution, and continuously stirring for 2 to 6 hours to obtain a second intermediate product solution; and cooling the second intermediate product solution to room temperature, adding an acidic solution for neutralizing the second intermediate product solution, adding water with stirring, discarding waste liquid, and removing the solvent under vacuum distillation, to prepare the phosphorus-containing polyphenylene oxide resin. Accordingly, the prepared phosphorus-containing polyphenylene oxide resin is a phosphorus-containing polyphenylene oxide resin with terminal hydroxyl.

More specifically, based on 1 mole of dihydroxyl polyphenylene oxide, the amount of the di(chloromethyl) compound is greater than 0 mole and smaller than or equivalent to 1 mole, and the amount of the phase transfer catalyst is greater than or equivalent to 0.01 mole and smaller than or equivalent to 1 mole; wherein the solvent comprises 30 wt % to 70 wt % of the whole first mixture solution. The above method comprises mixing the heated first intermediate product solution, 0.5 mole to 6 moles of alkali metal hydroxide and water and continuously stirring for 4 to 8 hours, so as to obtain the alkaline solution. The above method comprises mixing 1 mole to 10 moles of the phosphorus-containing compound and the cooled solution and continuously stirring for 2 to 6 hours, so as to obtain the second intermediate product solution. That is, based on 1 mole of dihydroxyl polyphenylene oxide, the amount of the phosphorus-containing compound is greater than or equivalent to 1 mole and smaller than or equivalent to 10 moles, the amount of the phase transfer catalyst is greater than or equivalent to 0.01 mole and smaller than or equivalent to 1 mole, and the amount of the alkali metal hydroxide is greater than or equivalent to 0.5 mole and smaller than or equivalent to 6 moles.

Further, more preferably, the above method comprises:

mixing the second intermediate product solution (a solution of a phosphorus-containing polyphenylene oxide resin with terminal hydroxyl) with a vinyl compound, a phase transfer catalyst and a solvent, stirring until the solution is completely dissolved, and continuously stirring for 2 to 6 hours to obtain a third intermediate product solution;

cooling the third intermediate product solution to room temperature, adding an acidic solution for neutralizing the third intermediate product, adding water with stirring, discarding waste liquid and removing the solvent under vacuum distillation to prepare the phosphorus-containing polyphenylene oxide resin. Accordingly, the prepared phosphorus-containing polyphenylene oxide resin is a phosphorus-containing polyphenylene oxide resin with terminal vinylbenzyl.

More specifically, the above method comprises mixing the second intermediate product solution (a solution of a phosphorus-containing polyphenylene oxide resin with terminal hydroxyl) with 0.1 mole to 4 moles of a vinyl compound and 0.01 mole to 1 mole of the phase transfer catalyst in a solvent to obtain the third intermediate product solution; wherein the solvent comprises 30 wt % to 70 wt % of the whole third intermediate product solution.

Preferably, the above dihydroxyl polyphenylene oxide can be polyphenylene oxide having one hydroxyl group at each of two terminals. The above dihydroxyl polyphenylene oxide can be SA-90 available from Sabic company, OPE available from MITSUBISHI GAS CHEMICAL COMPANY, INC. or their combination.

Preferably, the above di(chloromethyl) compound can be di(chloromethyl)benzene, di(chloromethyl) biphenyl, di(chloromethyl)ether or a combination thereof.

Preferably, the above vinyl compound can be a vinyl chloride compound, which is any aromatic compound that comprises vinyl and a chloro group or any aliphatic compound that comprises vinyl and a chloro group. A suitable vinyl compound includes 4-chloromethyl styrene, 3-chloromethyl styrene, 2-chloromethyl styrene, methacrylic acid, allyl chloride or a combination thereof. More preferably, a vinyl compound is 4-chloromethyl styrene, 3-chloromethyl styrene or 2-chloromethyl styrene.

Preferably, the above phosphorus-containing compound can be 2-(10H-9-oxa-10-phospha-1-phenanthryl)hydroquinone phosphorus oxide (DOPO-HQ), 2-(10H-9-Oxa-10- phospha-1-phenanthryl)naphthoquinone phosphorus oxide (DOPO-NQ), 2-(diphenylphosphinyl)hydroquinone (DPPO-HQ) or 2-(diphenylphosphinyl) naphthoquinone (DPPO-NQ).

Preferably, the above alkali metal hydroxide is sodium hydroxide or potassium hydroxide.

Preferably, the above phase transfer catalyst is quaternary ammonium salt or tetrabutylphosphonium bromide. More specifically, the above quaternary ammonium salt is tetra(n-butyl)ammonium bromide.

Preferably, the above acidic solution is phosphoric acid, hydrochloric acid, sulfuric acid or acetic acid. More preferably, the above acidic solution is phosphoric acid.

Preferably, the above solvent can be dimethylsulfoxide, dimethylformamide, dimethylacetamide, toluene, xylene or a combination thereof. More preferably, the above solvent is toluene.

The present invention further provides a method for preparing the prepolymer of phosphorus-containing polyphenylene oxide that comprises mixing the above phosphorus-containing polyphenylene oxide resin, a double bond-containing compound, peroxide and a solvent, so as to prepare the prepolymer of phosphorus-containing polyphenylene oxide. The double bond-containing compound can be isocyanate, triallyl isocyanate, isocyanurate, triallyl isocyanurate, cyanurate, triallyl cyanurate, maleimide, polyolefin, divinyl benzene or acrylic resin.

Preferably, the double bond-containing compound is triallyl isocyanurate (TAIC), triallyl cyanurate (TAC) or styrene-butadiene copolymer.

Preferably, in the above prepolymerization, the solvent to be used can be toluene, but is not limited to this. Preferably, the above peroxide can be dibromobenzyl peroxide, 2,5-dimethyl-2,5-di(t-butylperoxy)-3-hexyne, dicumyl peroxide, tert-butyl peroxybenzoate or di(tert-butyl peroxyisopropyl)benzene, so as to promote the cross-linking reaction.

The present invention further provides a resin composition that comprises a polyphenylene oxide resin. The polyphenylene oxide resin can be, such as the above phosphorus-containing polyphenylene oxide resin, the prepolymer of phosphorus-containing polyphenylene oxide or a combination thereof.

Preferably, the resin composition further comprises an additive, wherein the additive is selected from the group consisting of a flame retardant, an inorganic filler, polyolefin, a curing accelerator, a solvent, a surfactant, a toughener, cyanate ester, isocyanate, cyanurate, isocyanurate, maleimide and a combination thereof.

In one embodiment, the resin composition comprises, such as the above phosphorus-containing polyphenylene oxide resin, the prepolymer of phosphorus-containing polyphenylene oxide or a combination thereof, a flame retardant and a curing accelerator. More specifically, the resin composition comprises 100 parts by weight of the polyphenylene oxide resin, 10 parts by weight to 200 parts by weight of the flame retardant, and 0.01 to 5 parts by weight of the curing accelerator. Preferably, the amount of the flame retardant is 10 parts by weight to 90 parts by weight of; and more preferably, the amount of the flame retardant is 10 parts by weight to 50 parts by weight.

The above flame retardant can be a compound having flame retardance or a flame retardant functional group, for example, a phosphorus-containing compound, a nitrogen-containing compound or a bromo-containing compound. The selectable phosphorus-containing compound includes bisphenol diphenyl phosphate, ammonium polyphosphate, hydroquinone bis-(diphenyl phosphate), bisphenol A bis-(diphenylphosphate), tri(2-carboxyethyl) phosphine (TCEP), tri(chloroisopropyl)phosphate, trimethyl phosphate (TMP), dimethyl methyl phosphonate (DMMP), resorcinol bis(dixylenyl phosphate) (RDXP, such as PX-200, available from DAIHACHI CHEMICAL INDUSTRY CO., LTD.), phosphazene (such as SPB-100, available from Otsuka Chemical Co., Ltd.), m-phenylene methylphosphonate (PMP), melamine polyphosphate, 9,10-dihydro-9-oxa-10-phosphaphenanthrene-10-oxide (DOPO), DOPO-containing phenol resin (such as DOPO-containing-HQ resin), DOPO-containing novolak resin (DOPO-PN resin), DOPO-containing bisphenol novolak resin (DOPO-BPN resin), DOPO-containing epoxy resin, DOPO-HQ-containing epoxy resin, a diphenyl phosphine oxide (DPPO) compound, a diphenyl phosphine oxide derivative and so on, but is not limited to those. DOPO-BPN resin can be a bisphenol novolac compound, such as DOPO-bisphenol A novolac (DOPO-BPAN), DOPO-bisphenol F novolac (DOPO-BPFN), or DOPO-bisphenol S novolac (DOPO-BPSN). A selectable nitrogen-containing compound can be amino triazine novolac resin (ATN), melamine cyanurate, trihydroxy ethyl isocyanurate or a combination thereof, but is not limited to those. A selectable bromo-containing compound includes tetrabromobisphenol A (TBBPA), tetrabromocyclohexane, hexabromocyclodecane, 2,4,6-tris(tribromophenoxy)-1,3,5-triazine or decabromodiphenyl ethane (DBDPE), but is not limited to those.

The above curing accelerator can advantageously increase the reaction rate of a resin composition. Preferably, the curing accelerator can include Lewis base, Lewis acid or peroxide. A selectable Lewis base includes imidazole, boron trifluoride-amine complex, ethyltriphenyl phosphonium chloride, 2-methylimidazole (2MI), 2-phenyl-1H-imidazole (2PZ), 2-ethyl-4-methylimidazole (2E4MI), triphenylphosphine (TPP), 4-dimethylaminopyridine (DMAP) or a combination thereof. A selectable Lewis acid includes a metal (for example, manganese, iron, cobalt, nickel, copper, zinc and so on) salt compound, such as, zinc octoate, cobalt octoate, etc. A selectable peroxide includes dicumyl peroxide, tert-butyl peroxybenzoate or di(tert-butyl peroxyisopropyl)benzene, but is not limited to those. More preferably, the curing accelerator is di(tert-butyl peroxyisopropyl)benzene.

The above inorganic filler includes silica (fused, non-fused, porous or hollow), alumina, aluminum hydroxide, magnesia, magnesium hydroxide, calcium carbonate, aluminum nitride, boron nitride, aluminum silicon carbide, silicon carbide, titanium dioxide, zinc oxide, zirconia, mica, boehmite (AlOOH), calcined talc, talc, silicon nitride, calcined kaolin or a combination thereof. Preferably, the inorganic filler can be spherical, fibrous, in a plate form, granular, in a sheet form or in a needle-whisker form, and optionally, can be pre-treated by a silane coupling agent (a silane or siloxane compound). Preferably, the particle size of the inorganic filler is less than 100 μm, more preferably, between 1 nm and 20 μm, and even more preferably, greater than or equivalent to 1 nm and smaller than 1 μm. Preferably, based on 100 parts by weight of the polyphenylene oxide resin, the amount of the inorganic filler can be between 10 parts by weight and 200 parts by weight.

The above surfactant includes silane or siloxane. Preferably, based on 100 parts by weight of the inorganic filler, the amount of the surfactant is between 0.1 part by weight and 10 parts by weight. Accordingly, the surfactant can make sure that the inorganic filler in a resin composition evenly disperses in the resin composition, such that the resin composition can obtain better thermal conductivity and drilling performance.

The above polyolefin includes styrene-butadiene-divinylbenzene terpolymer, styrene-butadiene-maleic anhydride terpolymer, vinyl-polybutadiene-urethane oligomer, styrene-butadiene copolymer, hydrogenated styrene-butadiene copolymer, styrene-isoprene copolymer, hydrogenated styrene-isoprene copolymer or a combination thereof. Preferably, the polyolefin can be styrene-butadiene-divinylbenzene terpolymer, styrene-butadiene-maleic anhydride terpolymer, vinyl-polybutadiene-urethane oligomer or a combination thereof. Preferably, based on 100 parts by weight of polyphenylene oxide resin, the amount of polyolefin is between 5 parts by weight and 50 parts by weight. Accordingly, a resin composition containing the polyolefin can maintain a low dielectric constant and a low dissipation factor.

The above toughener includes: rubber, carboxyl-terminated butadiene acrylonitrile rubber (CTBN), core-shell rubber, etc. Preferably, based on 100 parts by weight of polyphenylene oxide resin, the amount of the toughener is between 1 part by weight and 10 parts by weight. Accordingly, a resin composition containing the toughener can obtain better toughness.

The above isocyanate includes 1,4-cyclohexane diisocyanate, isophorone diisocyanate, methylene bis(4-cyclohexylisocyanate), hydrogenated 1,3-xylylene diisocyanate or hydrogenated 1,4-xylylene diisocyanate, but is not limited to those. Preferably, based on 100 parts by weight of polyphenylene oxide resin, the amount of isocyanate is between 10 parts by weight and 100 parts by weight.

The above cyanurate can be triallyl cyanurate. Preferably, based on 100 parts by weight of polyphenylene oxide resin, the amount of cyanurate is between 10 parts by weight and 100 parts by weight, and more preferably, is between 30 parts by weight and 80 parts by weight.

The above isocyanurate is triallyl isocyanurate. Preferably, based on 100 parts by weight of polyphenylene oxide resin, the amount of isocyanurate is between 10 parts by weight and 80 parts by weight, and preferably, is between 30 parts by weight and 80 parts by weight.

The above maleimide can be 4,4'-diphenylmethane bismaleimide, the oligomer of phenylmethane maleimide, m-phenylene bismaleimide, bisphenol A diphenyl ether bismaleimide, 3,3'-dimethyl-5,5'-diethyl-4,4'-diphenylmethane bismaleimide, 4-methyl-1,3-phenylene bismaleimide, 1,6-bismaleimide-(2,2,4-trimethyl hexane) or a combination thereof. Preferably, based on 100 parts by weight of polyphenylene oxide resin, the amount of maleimide can be between 10 parts by weight and 100 parts by weight.

Preferably, the polyphenylene oxide resin in the resin composition can further comprises a first polyphenylene oxide resin, and the first polyphenylene oxide resin includes: dihydroxyl bisphenol A polyphenylene oxide (Trade name: SA-90 available from Sabic company), dihydroxyl biphenyl polyphenylene oxide (Trade name: OPE, available from MITSUBISHI GAS CHEMICAL COMPANY, INC.), bis(vinylbenzyl) biphenyl polyphenylene oxide resin (Trade name: OPE-2st, available from MITSUBISHI GAS CHEMICAL COMPANY, INC.), vinyl benzyl etherified modified bisphenol A polyphenylene oxide or methacrylic polyphenylene oxide resin (Trade name: SA-9000, available from Sabic company), but is not limited to those. Preferably, in the polyphenylene oxide resin, the ratio (wt %) of phosphorus-containing polyphenylene oxide resin, the prepolymer of phosphorus-containing polyphenylene oxide or a combination thereof to the above first polyphenylene oxide resin is between 1:99 and 99:1.

In the above resin composition, the solvent can be selected from methanol, ethanol, ethylene glycol monomethyl ether, acetone, butanone (also referred to as methyl ethyl ketone), methyl isobutyl ketone, cyclohexanone, toluene, xylene, methoxy ethyl acetate, ethoxy ethyl acetate, propoxy ethyl acetate, ethyl acetate, dimethylformamide, propylene glycol methyl ether or a combination thereof. Preferably, based on 100 parts by weight of polyphenylene oxide resin, the amount of the solvent can be between 100 parts by weight and 300 parts by weight.

Preferably, the solid content of the resin composition is between 55% and 75%.

Moreover, the present invention provides a resin article that comprises a lamella (such as cured resin composition or semi-cured resin composition) formed by curing the above resin composition. A suitable curing temperature is between 150° C. and 230° C. Specifically, the resin article can be a prepreg that have a reinforcing material and a resin composition disposed on the reinforcing material, wherein the lamella (i.e. semi-cured resin composition) is formed by high-temperature heating the above resin composition to a semi-cured state. The baking temperature for preparing a prepreg is between 80° C. and 170° C. The reinforcing material can be a fiber material, woven fabric and non-woven fabric, such as fiber glass cloth, etc., so as to increase the mechanical strength of the prepreg. Preferably, the reinforcing material can be optionally pre-treated by a silane coupling agent. The resin article can also be a resin film that is formed by semi-curing the resin composition after baking. The resin composition can optionally be coated on a polyethylene terephthalate film (PET film), a polyimide film or resin coated copper (RCC), and then be semi-cured after baking to form a resin film.

In addition, the resin article can also be a laminate that includes two metal foil sheets and one insulating layer (i.e., the above cured resin composition). The insulating layer is disposed between the metal foil sheets, and the insulating layer can be formed by curing the above resin composition under a high temperature and a high pressure. A suitable curing temperature is between 150° C. and 230° C. The insulating layer can be the above prepreg or resin film. The material of the metal foil can be copper, aluminum, nickel, platinum, silver, gold or an alloy thereof, such as copper foil. Preferably, the laminate is copper clad laminate (i.e. copper clad laminate). Preferably, the laminate can be further wire-processed to become a printed circuit board.

Through the use of the phosphorus-containing polyphenylene oxide resin of the present invention or the prepolymer of phosphorus-containing polyphenylene oxide, a resin article made from the resin composition that comprises the above phosphorus-containing polyphenylene oxide resin or the prepolymer of phosphorus-containing polyphenylene oxide can have (1) preferably flame retardance, at least V-1 or V-0 level, (2) preferably thermal resistance, which means that the resin article can maintain free of delamination at 288° C. for at least more than one hour, (3) a lower dielectric constant, (4) a lower dissipation factor, and (5) a lower percent of thermal expansion. Accordingly, the resin article (such as prepreg, laminate or printed circuit board) can be suitably used in an electronic product with high-speed and high-frequency signal transmission, so as to improve the reliability, thermal resistance and dimensional stability of the electronic product.

DETAILED DESCRIPTION OF THE INVENTION

To demonstrate the properties of the phosphorus-containing polyphenylene oxide resin of the present invention used in a laminate, a number of phosphorus-containing polyphenylene oxide resins are exemplified as follows for illustrating the embodiments of the present invention. A person skilled in the art can easily understand the advantages and effects achieved by the present invention through the content of the specification of the present application and can perform various modifications and changes without departing from the spirit of the present invention for utilizing or applying the content of the present invention.

Chemical components used in the following Examples and Comparative Examples are listed below.

1. Dihydroxyl bisphenol A polyphenylene oxide, Trade name: SA-90 available from Sabic company.
2. Dihydroxyl biphenyl polyphenylene oxide, Trade name: OPE available from MITSUBISHI GAS CHEMICAL COMPANY, INC.
3. Bis(vinylbenzyl) biphenyl polyphenylene oxide, Trade name: OPE-2st available from MITSUBISHI GAS CHEMICAL COMPANY, INC.
4. Phosphazene, Trade name: SPB-100 available from Otsuka Chemical Co., Ltd.

In the cooled reaction solution, 0.09 mole (8.8 g) of phosphoric acid and 165 g of deionized water were added and mixed evenly for neutralization. The solution was left still until precipitates occurred. The liquid solution except the precipitates was removed, and 330 g of deionized water was added for stirring. Again, the liquid solution except the precipitates was removed to complete a first washing procedure. Such washing procedure was repeated three times. Finally, the solvent was removed under vacuum distillation, so as to obtain the product.

Figure 1:
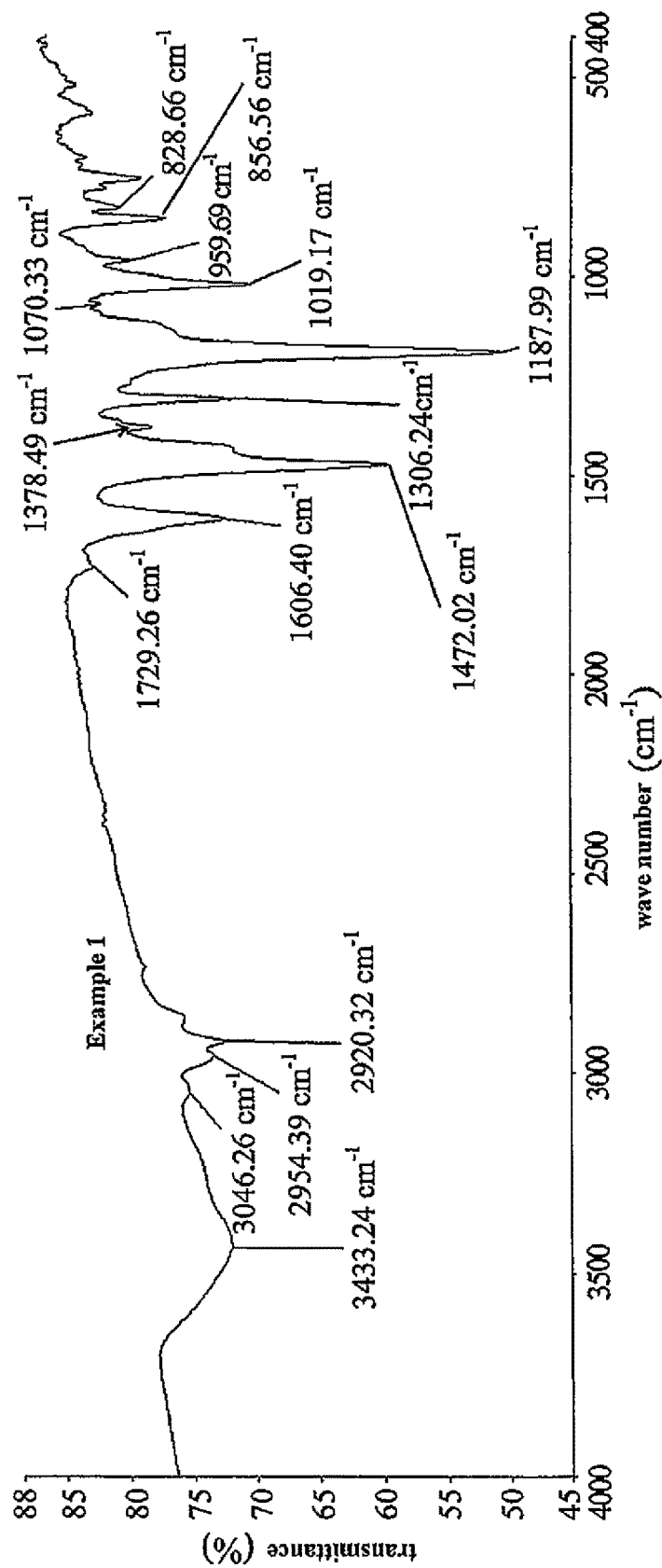
FIG. 1 shows the FTIR spectrogram of the phosphorus-containing polyphenylene oxide resin prepared in Example 1.

Reflective Fourier transform infrared spectroscopy (FTIR) was used for analyzing the resulting product. Its result is shown in FIG. 1. FTIR absorption peaks appear at 3433.24 cm$^{-1}$ (C—OH), 1466 cm$^{-1}$ to 1472 cm$^{-1}$ (P—C), 1187.99 cm$^{-1}$ (C—O—C), and 959.69 cm$^{-1}$ (P—O—C). Based on the FTIR analysis result, it can be confirmed that the resulting product is the phosphorus-containing polyphenylene oxide resin having a chemical structure represented by the following Formula (IV), wherein m is a positive integer of 1 to 10 and n is a positive integer of 1 to 10.

Formula (IV)

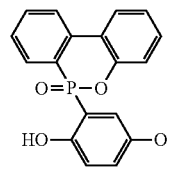 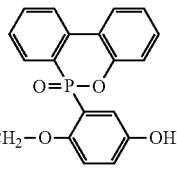

5. 2-(10H-9-oxa-10-phospha-1-phenanthryl)hydroquinone phosphorus oxide, abbreviated as DOPO-HQ available from SANKO GOSEI LTD.
6. 2-(diphenylphosphinyl) hydroquinone, abbreviated as DPPO-HQ available from HOKKO CHEMICAL INDUSTRY CO., LTD.
7. m-phenylene bismaleimide, Trade name: Homide125 available from Hos-Technik Vertriebs- and Produktions-GmbH.
8. 2,5-dimethyl-2,5-di(tert-butylperoxy)-3-hexyne, Trade name: 25B available from Nippon Oil & Fats Co., Ltd.
9. Bisphenol A cyanate ester resin, Trade name: BA-230S available from Lonza.
10. Styrene-butadiene-divinylbenzene terpolymer, Trade name: Ricon257 available from Cray Valley.
11. Spherical silica, Trade name: SC-2050 available from Admatechs.
12. Zinc octoate available from Kingyorker Enterprise Co. Ltd.
13. Triallyl isocyanurate available from Kingyorker Enterprise Co. Ltd.

Example 1: Preparation of Phosphorus-Containing Polyphenylene Oxide Resin 0.2 mole (400 g) of dihydroxyl bisphenol A polyphenylene oxide (SA-90), 0.1 mole (17.5 g) of α,α'-dichloro-p-xylene, 0.01 mole (3.39 g) of tetrabutyl phosphonium bromide and 600 g of toluene were added to a stirring tank, heated to 75° C. and stirred until the above were completely dissolved and mixed evenly.

Subsequently, after the well-mixed solution was heated to 95° C., it was continuously stirred for 6 hours. 1.125 mole (45 g) of sodium hydroxide and 33 g of deionized water were added and continuously stirred for 6 hours. After the solution was cooled to 70° C., 2 moles (650 g) of DOPO-HQ was added and continuously stirred for 4 hours. The reaction was then cooled to room temperature.

Example 2: Preparation of Phosphorus-Containing Polyphenylene Oxide Resin

To all of the phosphorus-containing polyphenylene oxide resin prepared in above Example 1, 0.35 mole (53.4 g) of p-chloromethyl styrene (p-CMS), 0.01 mole (3.39 g) of tetrabutyl phosphonium bromide and 500 g of toluene were added, and then heated to 75° C. with continuously stirring for 4 hours. Subsequently, the reaction solution was cooled to room temperature.

Subsequently, to the cooled reaction solution, 0.09 mole (8.8 g) of phosphoric acid and 165 g of deionized water were added for neutralization and left still until the solution was divided into an upper layer and a lower layer (the upper layer was a solution while the lower layer was precipitates). 330 g of deionized water was added for stirring, and then the washing procedure was repeated three times. Finally, the solvent was removed under vacuum distillation, so as to obtain the product.

Figure 2:
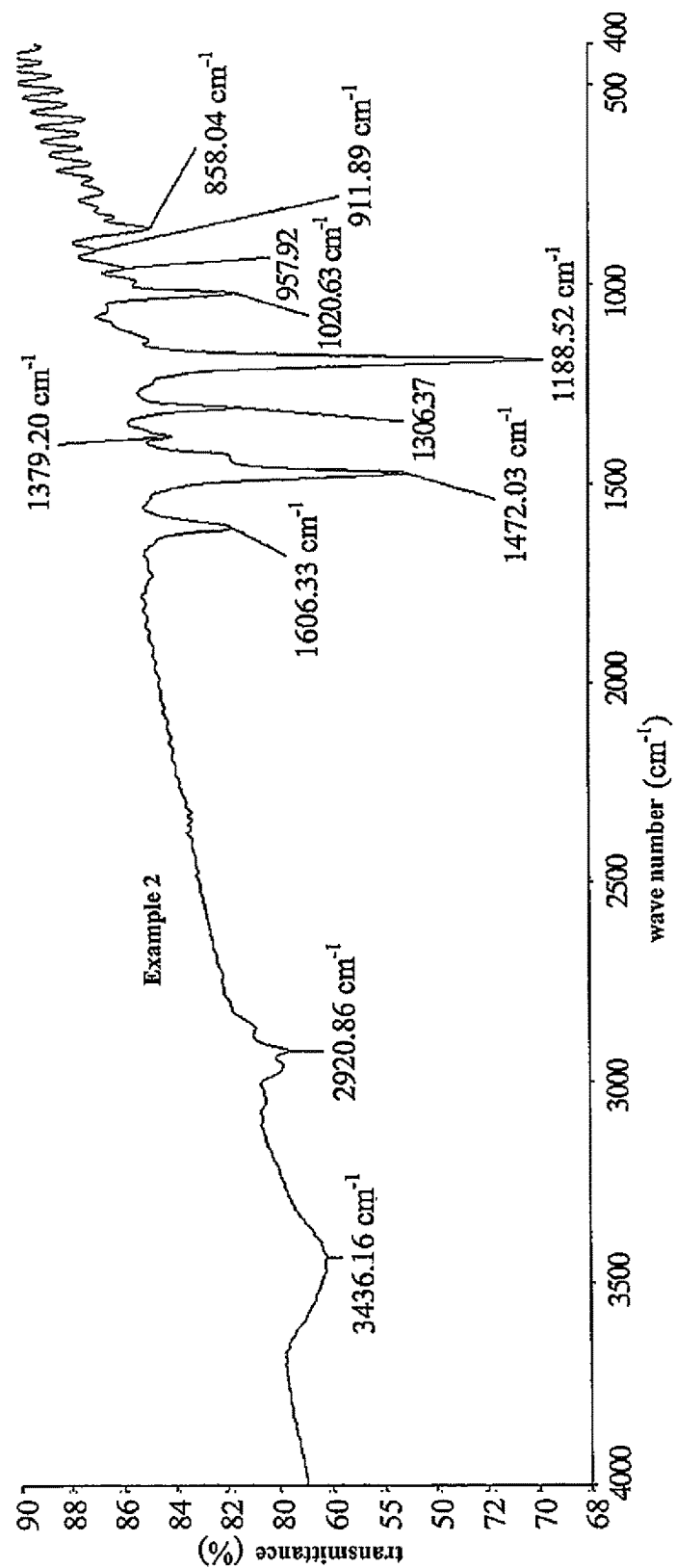
FIG. 2 shows the FTIR spectrogram of the phosphorus-containing polyphenylene oxide resin prepared in Example 2.
Figure 3:
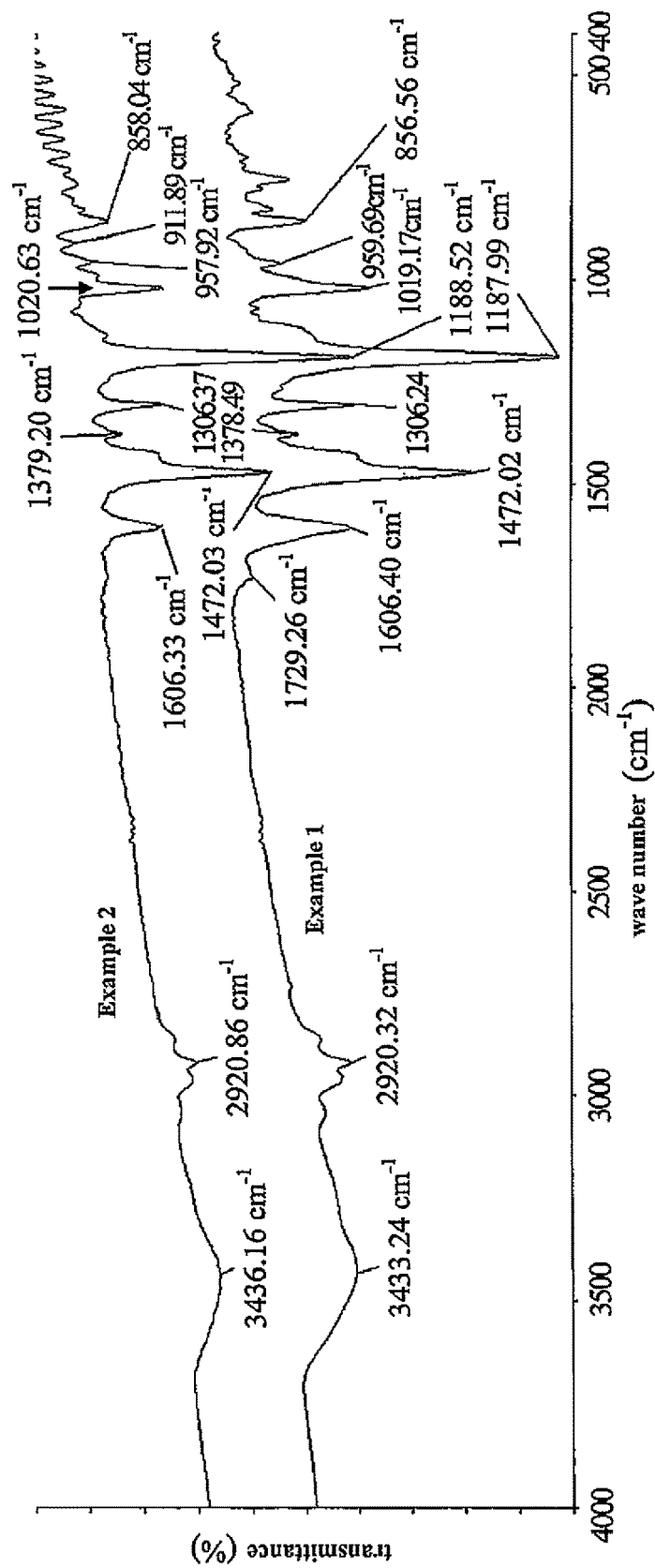
FIG. 3 shows a comparison between the FTIR spectrograms of the phosphorus-containing polyphenylene oxide resins prepared in Example 1 and Example 2.

FTIR was used to analyze the resulting product of this Example and its result is shown in FIG. 2. FTIR absorption peaks appear at 911.89 cm$^{-1}$ (—C=C—), 1466 cm$^{-1}$ to 1472 cm$^{-1}$ (P—C), 1188.52 cm$^{-1}$ (C—O—C), and 957.92 cm$^{-1}$ (P—O—C). The FTIR spectrograms of Example 1 and Example 2 are further compared. As shown in FIG. 3, in the FTIR spectrogram of the phosphorus-containing polyphenylene oxide resin made from Example 2, one extra absorption peak for a vinyl functional group occurs at 912 cm$^{-1}$. Therefore, based on the FTIR analysis result, it can be confirmed that the resulting product is the phosphorus-containing polyphenylene oxide resin having a chemical structure represented by the following Formula (V), wherein in is a positive integer of 1 to 10 and n is a positive integer of 1 to 10.

Formula (V)

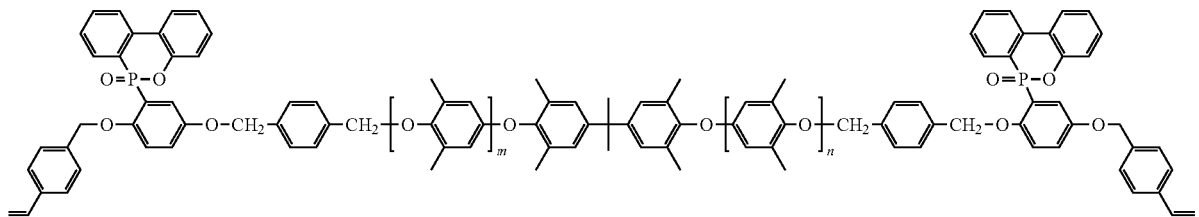

Example 3: Preparation of Phosphorus-Containing Polyphenylene Oxide Resin

The phosphorus-containing polyphenylene oxide resin of this example was prepared based on the method described in Example 1 except that in this example, 0.2 mole (400 g) of OPE was used instead of SA-90 in Example 1 and 0.1 mole (25.12 g) of dichloromethyl biphenyl was used instead of α,α'-dichloro-p-xylene in Example 1. A phosphorus-containing polyphenylene oxide resin having a chemical structure represented by the following Formula (VI) was prepared, wherein m is a positive integer of 1 to 10 and n is a positive integer of 1 to 10.

Formula (VI)

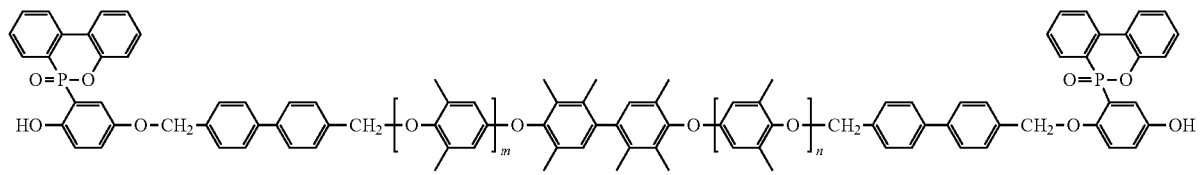

Example 4: Preparation of Phosphorus-Containing Polyphenylene Oxide Resin

To all of the phosphorus-containing polyphenylene oxide resin prepared in the above Example 3, 0.35 mole (30.1 g) of methacrylic acid, 0.01 mole (3.39 g) of tetrabutyl phosphonium bromide and 500 g of toluene were added, heated to 75° C. and stirred for 4 hours. The reaction solution was then cooled to room temperature.

Subsequently, to the cooled reaction solution, 0.09 mole (8.8 g) of phosphoric acid and 165 g of deionized water were added for neutralization and left still until the solution was divided into an upper layer and a lower layer the upper layer was a solution while the lower layer was precipitates). 330 of deionized water was added for stirring, and then the washing procedure was repeated three times. Finally, the solvent was removed under vacuum distillation, so as to obtain the product represented by the following Formula (VII), wherein m is a positive integer of 1 to 10 and n is a positive integer of 1 to 10.

Formula (VII)

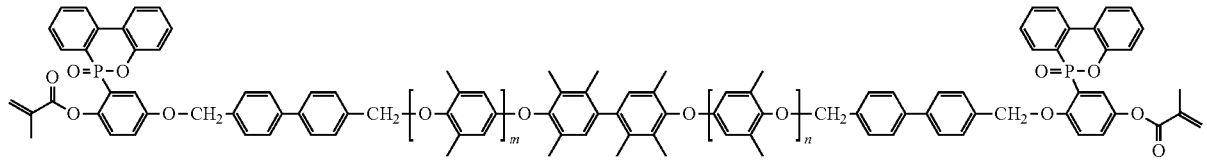

Example 5: Preparation of Phosphorus-Containing Polyphenylene Oxide Resin

The phosphorus-containing polyphenylene oxide resin in this example was prepared based on the method of Example 1, except that 0.2 mole (23 g) of di(chloromethyl)ether was used in this example instead of α,α'-dichloro-p-xylene in Example 1 and 2 moles (616 g) of DPPO-HQ was used instead of DOPO-HQ in Example 1. A phosphorus-containing polyphenylene oxide resin having a chemical structure represented by the following Formula (VIII) was prepared, wherein m is a positive integer of 1 to 10 and n is a positive integer of 1 to 10.

Formula (VIII)

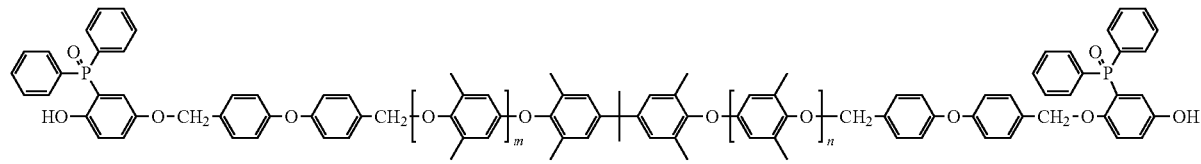

Example 6: Preparation of Phosphorus-Containing Polyphenylene Oxide Resin

To all of the phosphorus-containing polyphenylene oxide resin prepared in the above Example 5, 0.35 mole (26.8 g) of allyl chloride, 0.01 mole (3.39 g) of tetrabutyl phosphonium bromide and 500 g of toluene were added, heated to 75° C. and stirred for 4 hours. The reaction solution was then cooled to room temperature.

Subsequently, to the cooled reaction solution, 0.09 mole (8.8 g) of phosphoric acid and 165 g of deionized water were added for neutralization and left still until the solution was divided into an upper layer and a lower layer (the upper layer was a solution while the lower layer was precipitates). 330 of deionized water was added for stirring, and then the washing procedure was repeated three times. Finally, the solvent was removed under vacuum distillation, so as to obtain the product represented by the following Formula (IX), wherein m is a positive integer of 1 to 10 and n is a positive integer of 1 to 10.

Formula (IX)

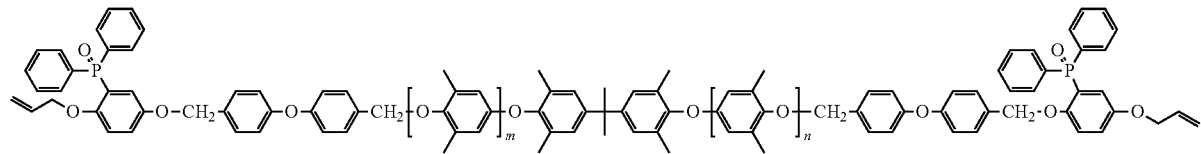

Example 7: Preparation of Phosphorus-Containing Polyphenylene Oxide Resin

The phosphorus-containing polyphenylene oxide resin in this example was prepared based on the method described in Example 1, except that in this example, 0.2 mole (38.2 g) of 2,5-dichlorobenzoic acid was used instead of α,α'-dichloro-p-xylene in Example 3. A phosphorus-containing polyphenylene oxide resin having a chemical structure represented by the following Formula (X) was prepared, wherein m is a positive integer of 1 to 10 and n is a positive integer of 1 to 10.

Formula (X)

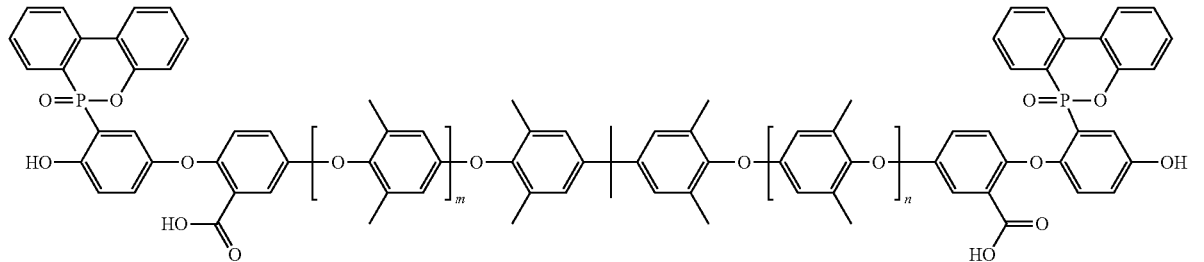

Example 8: Preparation of Phosphorus-Containing Polyphenylene Oxide Resin

The phosphorus-containing polyphenylene oxide resin in this example was prepared based on the method described in Example 1, except that in this example, 2 moles (616 g) of DPPO-HQ was used instead of DOPO-HQ in Example 1. A phosphorus-containing polyphenylene oxide resin having a chemical structure represented by the following Formula (XI) was prepared, wherein m is a positive integer of 1 to 10 and n is a positive integer of 1 to 10.

Formula (XI)

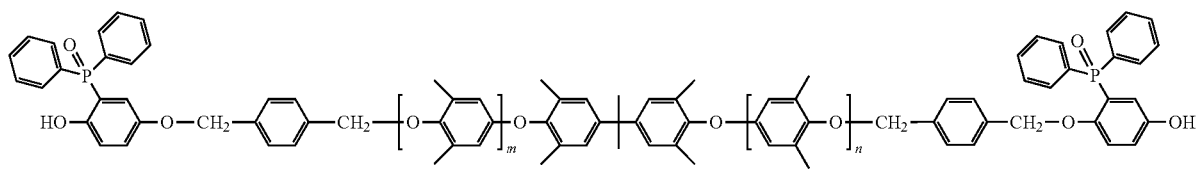

Example 9: Preparation of Prepolymer of Phosphorus-Containing Polyphenylene Oxide 50 g of the phosphorus-containing polyphenylene oxide resin made from Example 2 and 50 g of triallyl isocyanurate were added to a stirring tank containing 100 g of toluene, heated to 85° C. and stirred to dissolve until evenly mixing. 0.5 g of dibenzyl peroxide (Trade name: NYPER BW available from Nippon Oil & Fats Co., Ltd.) was added to react for 8 hours, so as to form a product that was the triallyl isocyanurate prepolymerized prepolymer of vinylbenzyl phosphorus-containing polyphenylene oxide.

Example 10: Preparation of Prepolymer of Phosphorus-Containing Polyphenylene Oxide 50 g of the phosphorus-containing polyphenylene oxide resin made from Example 2 and 50 g of styrene-butadiene copolymer (Trade name: Ricon 181 available from Cray Valley) were added to a stirring tank containing 100 g of toluene, heated to 85° C. and stirring to dissolve until evenly mixing. 0.5 g of dibenzyl peroxide was added to react for 8 hours, so as to form a product that was the styrene-butadiene prepolymerized prepolymer of vinylbenzyl phosphorus-containing polyphenylene oxide.

Example 11: Preparation of Resin Composition

In this example, the phosphorus-containing polyphenylene oxide resin made from Example 1 was used. Based on the components shown in Table 1, the phosphorus-containing polyphenylene oxide resin made from Example 1, a flame retardant (SPB-100), a bisphenol A cyanate ester resin (i.e., the above BA-230S), peroxide (i.e., the above 25B), zinc octoate (as a curing accelerator), an inorganic filler (i.e., the above SC-2050), toluene and butanone (methyl ethyl ketone, MEK) were mixed, so as to prepare the resin composition in Example 11 (abbreviated as E11 in Table 1).

Example 12: Preparation of Resin Composition

In this example, the phosphorus-containing polyphenylene oxide resin made from Example 2 was used. Based on the components shown in Table 1, the phosphorus-containing polyphenylene oxide resin made from Example 2, a flame retardant (SPB-100), a bisphenol A cyanate ester resin (i.e., the above BA-230S), peroxide (i.e., the above 25B), zinc octoate (as a curing accelerator), an inorganic filler (i.e., the above SC-2050), toluene and butanone (methyl ethyl ketone, MEK) were mixed, so as to prepare the resin composition in Example 12 (abbreviated as E12 in Table 1).

Examples 13 and 14: Preparation of Resin Compositions

In Examples 13 and 14, the phosphorus-containing polyphenylene oxide resin made from Example 2 was used. Based on the components shown in Table 1, the phosphorus-containing polyphenylene oxide resin made from Example 2, m-phenylene bismaleimide (i.e., the above Homide 125), peroxide (i.e., the above 25B), an inorganic filler (i.e., the above SC-2050), toluene and butanone were mixed, so as to prepare the resin compositions in Example 13 and Example 14 (abbreviated as E13 and E14, respectively, in Table 1). In the resin composition of Example 14, a flame retardant (SPB-100) was added.

Examples 15 to 17: Preparation of Resin Compositions

In Examples 15 to 17, the phosphorus-containing polyphenylene oxide resin made from Example 2 was used.

Based on the components shown in Table 3, the phosphorus-containing polyphenylene oxide resin made from Example 2, Ricon257, TAIL, a flame retardant (SPB-100), a bisphenol A cyanate ester resin (i.e., the above BA-230S), m-phenylene bismaleimide (i.e., the above Homide 125), peroxide (i.e., the above 25B), an inorganic filler (i.e., the above SC-2050), toluene and butanone were mixed, so as to prepare the resin compositions in Example 15 to 17 (abbreviated as E15 to E17, respectively, in Table 3).

In the resin composition of Example 15, only the phosphorus-containing polyphenylene oxide resin made from Example 2 was used. In the resin compositions of Examples 16 and 17, the phosphorus-containing polyphenylene oxide resin made from Example 2 and OPE-2st were used.

Comparative Example 1: Preparation of Resin Composition

The resin composition in Comparative Example 1 (abbreviated as C1 in Table 1) was basically the same as that of Example 11, except that in the resin composition of this comparative example, SA-90 was used instead of the phosphorus-containing polyphenylene oxide resin made from Example 1. The specific components for such resin composition are shown in Table 1.

Comparative Example 2: Preparation of Resin Composition

The resin composition in Comparative Example 2 (abbreviated as C2 in Table 1) was basically the same as that of Example 12, except that in the resin composition of this comparative example, OPE-2st was used instead of the phosphorus-containing polyphenylene oxide resin made from Example 2. The specific components for such resin composition are shown in Table 1.

Comparative Examples 3 and 4: Preparation of Resin Compositions

The resin compositions in Comparative Examples 3 and 4 (abbreviated as C3 and C4, respectively, in Table 1) were basically the same as that of Example 13, except that in the resin composition of Comparative Examples 3 and 4, OPE-2st was used instead of the phosphorus-containing polyphenylene oxide resin made from Example 2 and in the resin composition of Comparative Example 4, the amount of the flame retardant was increased to 35 parts by weight. The specific components for the resin compositions of Comparative Examples 3 and 4 are shown in Table 1.

Comparative Examples 5 and 6: Preparation of Resin Composition

The resin compositions in Comparative Examples 5 and 6 (abbreviated as C5 and C6, respectively, in Table 1) were basically the same as that of Example 13, except that in the resin composition of Comparative Examples 5 and 6, OPE-2st was used instead of the phosphorus-containing polyphenylene oxide resin made from Example 2, DOPO-HQ was used as a flame retardant and the amounts of the flame retardant were 35 and 50 parts by weight, respectively. The specific components for the resin compositions of Comparative Examples 5 and 6 are shown in Table 1.

Comparative Examples 7 and 8: Preparation of Resin Composition

The resin compositions of Comparative Examples 7 and 8 (abbreviated as C7 and C8, respectively, in Table 3) were basically the same as that of Example 14, except that in the resin compositions of Comparative Examples 7 and 8, OPE-2st was used instead of the phosphorus-containing polyphenylene oxide resin made from Example 2 and in the resin composition of Comparative Example 8, DOPO-HQ was used instead of SPB-100 used in the resin composition of Example 14. The specific components for the resin compositions of Comparative Examples 7 and 8 are shown in Table 3.

Comparative Examples 9 to 12: Preparation of Resin Composition

The resin compositions of Comparative Examples 9 to 12 (abbreviated as C9 to C12, respectively, in Table 3) were basically the same as that of Example 15 or 16, except that in the resin compositions of Comparative Examples 9, 10 and 12, only OPE-2st was used as a polyphenylene oxide resin, in the resin composition of Comparative Example 11, only SA-90 was used as a polyphenylene oxide resin instead of the phosphorus-containing polyphenylene oxide resin of the present invention. In the resin composition of Comparative Example 12, DOPO-HQ was used as a flame retardant instead of SPB-100 in Example 15 or 16. In the resin compositions of Comparative Examples 10 to 12, the amounts of the flame retardant were higher than that in Example 15 or 16. The specific components for the resin compositions of Comparative Examples 9 to 12 are shown in Table 3.

Test Example: Property Analysis for Resin Composition

In this test example, the resin composition of Examples 11 to 17 and the resin composition of Comparative Examples 1 to 12 were used. Each resin composition was placed in an impregnation tank, and then a glass fiber fabric (2116 E-glass fiber fabric, available from Nan Ya Plastics Corporation) was dipped in the above impregnation tank, such that the resin composition was adhered to the glass fiber fabric. The glass fiber fabric was baked at 150° C. to a semi-cured state to obtain a prepreg with a thickness of 0.127 millimeters.

Samples for Property Analysis:
1. Copper Clad Laminate:

Two copper foils with a thickness of 18 micrometers and four prepregs made from the samples were provided. In each prepreg, the resin content was about 55%. One copper foil, four prepregs and one copper foil were stacked sequentially, and then were laminated in a vacuum condition at 210° C. for 2 hours to form a copper clad laminate, wherein the four laminated prepregs were cured to form an insulating layer between two copper foils and the resin content in the insulating layer was about 55%.

2. Copper-Free Laminate (Four Layers):

The above copper clad laminate was etched to remove two copper foils, so as to obtain a copper-free laminate (four layers). The copper-free laminate (four layers) was formed by laminating four prepregs, and the resin content of the copper-free laminate (four layers) was about 55%.

3. Copper-Free Laminate (Two Layers):

Two copper foils with a thickness of 18 micrometers and two prepregs made from the samples were provided (the thickness of each prepreg is 0.127 millimeters). The resin content of each prepreg was about 55%. One copper foil, two prepregs and one copper foil were stacked sequentially, and then were laminated in a vacuum condition at 210° C. for 2 hours to form a two-layer copper clad laminate.

Subsequently, the above copper clad laminate was etched to remove two copper foils, so as to obtain a copper-free laminate (two layers). The insulating laminate was formed by laminating two prepregs. The resin content of the copper-free laminate (two layers) was about 55%.

Each property analysis item and a test method thereof are illustrated as follows.

1. Percent of Thermal Expansion (the Total Percent of Thermal Expansion):

In the measurement of a percent of thermal expansion, a copper-free laminate was used as a sample. In a temperature range of 50° C. to 260° C., a thermal mechanical analyzer (TMA) was used, and based on the method described in IPC-TM-650 2.4.24.5, the dimension exchange rate (unit: %) for each sample was measured. The lower a percent of thermal expansion is, the better the laminate is.

2. Thermal Resistance T288:

In a thermal resistance, the above copper clad laminate with 6.5 mm×6.5 mm was used as a sample. At a constant temperature of 288° C., a thermal mechanical analyzer was used and based on the method described in IPC-TM-650 2.4.24.1, the time that no delamination occurred after the copper clad laminate was heated was measured. A longer time means that the thermal resistance of the copper clad laminate made from the resin composition is better.

3. Dielectric Constant and Dissipation Factor:

In the measurements for a dielectric constant and a dissipation factor, the above copper-free laminate (two layers) was used as a sample. A microwave dielectrometer (available from Japan AET Company) was used and based on the method described in JIS C2565, each sample was measured at room temperature and a frequency of 10 GHz. The lower a dielectric constant and a dissipation factor are, the better the dielectric properties of a sample are. The Dk value difference smaller than 0.05 means that laminates do not have a significant difference in dielectric constant while the Dk value difference greater than 0.05 means that different laminates have a significant difference in dielectric constant. The Df value difference smaller than 0.0005 means that laminates do not have a significant difference in dissipation factor while the Df value difference greater than 0.0005 means that different laminates has a significant difference in dissipation factor.

4. Flame Retardance Test:

In a flame retardance test, a copper-free laminate (four layers) with 125 mm×13 mm was used as a sample. Based on the method of UL94, measurement was performed and the results of flame retardance analyses can be expressed as V-0, V-1, and V-2, wherein the flame retardance of V-0 is better than the flame retardance of V-1 and the flame retardance of V-1 is better than the flame retardance of V-2. If a sample is burned up, the flame retardance is the worst.

The samples made from the resin compositions of Examples 11 to 17 were tested based on the above test methods and the property analysis results are listed in the following Tables 2 and 4. The samples made from the resin compositions of Comparative Examples 1 to 12 were tested based on the above test methods and the property analysis results are listed in the following Tables 2 and 4.

As shown in Table 2, from the property results of Examples 11 to 14 and Comparative Examples 1 to 6, it can be seen that the laminates made from the resin compositions of Examples 11 to 14 could maintain no delamination at 288° C. for over 1 hour, dissipation factors were all below 0.01 (in Examples 13 and 14, the dissipation factors are even lower than 0.008) and the flame retardance could be V-1 or V-0. However, the resin composition of Comparative Examples 1 to 6 could not have the above properties at the same time. It is demonstrated that a laminate made from the resin composition having the phosphorus-containing polyphenylene oxide resin of Example 1 or 2 indeed had better thermal resistance and flame retardance than current techniques while the dielectric properties of the laminate were maintained.

To further investigate the effects of the polyphenylene oxide resin types on the properties of a laminate, as shown in Table 2, the comparison between Example 11 and Comparative Example 1 demonstrates that a laminate made from the resin composition having the phosphorus-containing polyphenylene oxide resin of Example 1 could provide better thermal resistance and flame retardance while a low dissipation factor was maintained, compared with the current polyphenylene oxide resin (SA-90). Furthermore, as shown in Table 2, the comparison between Example 12 and Comparative Example 1 also demonstrate that a laminate made from the resin composition having the phosphorus-containing polyphenylene oxide resin of Example 2 could provide better thermal resistance and flame retardance while a low dissipation factor was maintained, compared with the current polyphenylene oxide resin (SA-90).

In addition, the comparison between Example 13 and Comparative Example 2 and the comparison between Example 14 and Comparative Example 3 demonstrate that the flame retardance of the laminate made from Example 13 was significantly better than that of the laminate in Comparative Example 2; the flame retardance of the laminate made from Example 14 was significantly better than that of the laminate made from Comparative Example 3; the dissipation factor of the laminate made from Example 13 did not significantly change, compared with that of the laminate made from Comparative Example 2; and the dissipation factor of the laminate made from Example 14 did not significantly change, compared with that of the laminate made from Comparative Example 3. As such, compared with current vinylbenzyl-terminated polyphenylene oxide resin (OPE-2st), a laminate made from the resin composition having the vinylbenzyl-terminated phosphorus-containing polyphenylene oxide resin of Example 2 could provide more excellent flame retardance and a low dissipation factor was, maintained.

Moreover, from the property results of Example 13 and Example 14 in Table 2, it can be seen that when a resin composition having the phosphorus-containing polyphenylene oxide resin of Example 2, a small amount of a flame retardant in the resin composition allowed the flame retardance of the laminate to improve from V-1 to V-0. Although the dissipation factor increased from 0.0074 (Example 13) to 0.0077 (Example 14), the difference between them did not exceed 0.0005, that is, the dielectric properties were not significantly worsened because of the addition of a flame retardant and the thermal resistance of the laminate was not affected because of the flame retardant. Therefore, the phosphorus-containing polyphenylene oxide resin made from Example 2 is suitable to use with a flame retardant. A laminate made from such resin composition could have good thermal resistance and a low dissipation factor while the flame retardance could be improved to V-0.

In view of the property results of Comparative Examples 2 to 4 in Table 2, when OPE-2st was used in a resin composition as a polyphenylene oxide resin, 15 parts by weight of the flame retardant (SPB-100, identical to that in Example 14) in such resin composition could only improve the flame retardance of the laminate to V-2, which does not match the specifications of electronic products. To further improve the flame retardance of the laminate, if the amount of a flame retardant was increased to 35 parts by weight, the flame retardance of the laminate could be improved to V-0, but its dissipation factor was increased to 0.0085. That is, the difference between the dissipation factors of the laminate made from the resin composition of Comparative Example 4 and the laminate made from the resin composition of Comparative Example 2 or 3 was more than 0.0005. That means excess flame retardant adversely affects the dielectric properties of a laminate and even significantly worsens the thermal resistance of a laminate.

From the property results of Comparative Examples 2, 5 and 6 in Table 2, it can be seen that when OPE-2st was used in a resin composition as a polyphenylene oxide resin, although 35 or 50 parts by weight of a flame retardant (DOPO-HQ) in a resin composition could improve the flame retardance of a laminate, the dissipation factor of a laminate was adversely increased to 0.0108 or 0.0121 and on the laminate, delamination happened at 288° C. after heating less than 15 minutes. Therefore, although flame retardance could be improved after various flame retardants were added to a resin composition comprising a current polyphenylene oxide resin, the dielectric properties and thermal resistance of the laminate could not reach the requirements of a laminate. The overall property of a laminate could not be improved.

In addition, from the property results of Example 14 and Comparative Examples 4 to 6 in Table 2, it can be seen that even though a larger amount of a flame retardant could improve the flame retardance of the laminate made from Comparative Example 4, the dissipation factor of the laminate made from any one of Comparative Examples 4 to 6 was higher than that (0.0005) of the laminate made from Example 14. Therefore, if the amount of a flame retardant was increased without the use of the polyphenylene oxide resin of the present application, the effects of maintaining dielectric properties and increasing thermal resistance and flame retardance cannot be achieved.

From Table 4, in view of the property results of Examples 15 to 17 and Comparative Examples 7 to 12, it can be seen that the laminates made from the resin compositions of Examples 15 to 17 could have a percent of thermal expansion lower than 3%, free of delamination at 288° C. for more than 1 hour, a dielectric constant lower than 4.0, a dissipation factor lower than 0.008, and V-0 of flame retardance. However, the resin compositions of Comparative Examples 7 to 12 could not have the above properties at the same time. It is demonstrated that a resin composition containing the phosphorus-containing polyphenylene oxide resin made from Example 2 had a lower percent of thermal expansion, better thermal resistance, a lower dielectric constant, a lower dissipation factor and better flame retardance, compared with the prior art.

To further investigate the effects of polyphenylene oxide resin types on the properties of a laminate, from the property results of Example 15 and Comparative Examples 7 and 8 in Table 4, it is demonstrated that compared with the resin composition containing current OPE-2st, a laminate made from the resin composition containing the phosphorus-containing polyphenylene oxide resin of Example 2 could provide better flame retardance. Also, from the property results of Example 16 or 17 and Comparative Example 9, it is demonstrated that compared with the use of current OPE-2st, a laminate made from the resin composition containing the phosphorus-containing polyphenylene oxide resin of Example 2 could also provide more excellent flame retardance.

From the property results of Comparative Examples 9 and 10 in Table 4, although the flame retardance of a laminate made from the resin composition of Comparative Example 10 could be improved by increasing the amount of the flame retardant from 33 parts by weight to 50 parts by weight, the dielectric constant and dissipation factor were adversely increased and the thermal resistance was lowered. The purposes of maintaining the dielectric properties and increasing the thermal resistance and flame retardance could not be realized, such that the overall property of the laminate could not match the specifications. Moreover, from the property results of Comparative Examples 9, 10 and 12 in Table 4, even though 65 parts by weight of DOPO-HQ was used to improve the flame retardance of a laminate, the laminate made from Comparative Example 12 had disadvantages, such as a high dielectric constant, a high dissipation factor and insufficient thermal resistance. Furthermore, from the property results of Comparative Examples 10 and 11 in Table 4, when SA-90 was used as a polyphenylene oxide resin, even though the amount of a flame retardant was increased to 50 parts by weight, the flame retardance of a laminate made from the resin composition of Comparative Example 11 could not be effectively improved. In addition, such laminate had problems such as worse thermal resistance, a high dielectric constant and a high dissipation factor.

To further investigate the effects of chemical structures of polyphenylene oxide resins on the properties of a laminate, the the property results of Example 15 and Comparative Example 8 in Table 4, although in Comparative Example 8, DOPO-HQ was used as a flame retardant and OPE-2st was the vinylbenzyl polyphenylene oxide resin, on the main skeleton of the vinylbenzyl polyphenylene oxide resin of Comparative Example 8, a DOPO functional group was not directly bond to it and DOPO-HQ was additionally admixed in the resin composition. Therefore, the laminate made from the resin composition of Comparative Example 8 had thermal resistance, dielectric properties (including dielectric constant and dissipation factor) and flame retardance all worse than those of the laminate made from the resin composition of Example 15. Also, from the property results of Example 15 and Comparative Examples 8 and 12 in Table 4, although the flame retardance of a laminate made from the resin composition of Comparative Example 12 could be improved by increasing the amount of a flame retardant from 24 parts by weight to 65 parts by weight, the dielectric constant and dissipation factor of such laminate were adversely increased and the thermal resistance of such laminate was significantly weakened. From the above experimental results, it is again demonstrated that when the phosphorus-containing polyphenylene oxide resin of the present invention was used in a resin composition, a laminate made therefrom indeed had better thermal resistance, dielectric properties and flame retardance and a lower percent of thermal expansion.

It is intended that the above examples are considered as exemplary only and are not intended to limit the claimed scope of the present application in any way. A true scope of the invention is indicated by the following claims rather than the above embodiments

TABLE 1

Components of the resin compositions of Examples 11 to 14 and Comparative Examples 1 to 6 (unit: part by weight)

| Component Type | Component Name | E11 | E12 | C1 | E13 | E14 | C2 | C3 | C4 | C5 | C6 |
|---|---|---|---|---|---|---|---|---|---|---|---|
| Polyphenylene oxide resin | Example 1 | 40 | — | — | — | — | — | — | — | — | — |
| | Example 2 | — | 40 | — | 100 | 100 | — | — | — | — | — |
| | SA-90 | — | — | 40 | — | — | — | — | — | — | — |
| | OPE-2st | — | — | — | — | — | 100 | 100 | 100 | 100 | 100 |

TABLE 1-continued

Components of the resin compositions of Examples 11 to 14 and
Comparative Examples 1 to 6 (unit: part by weight)

| Component Type | Component Name | E11 | E12 | C1 | E13 | E14 | C2 | C3 | C4 | C5 | C6 |
|---|---|---|---|---|---|---|---|---|---|---|---|
| Flame retardant | SPB-100 | 30 | 30 | 30 | — | 15 | — | 15 | 35 | — | — |
|  | DOPO-HQ | — | — | — | — | — | — | — | — | 35 | 50 |
| Bismaleimide | Homide125 | — | — | — | 30 | 30 | 30 | 30 | 30 | 30 | 30 |
| Cyanate ester | BA-230S | 100 | 100 | 100 | — | — | — | — | — | — | — |
| Curing accelerator | 25B | 1 | 1 | 1 | 2 | 2 | 2 | 2 | 2 | 2 | 2 |
|  | zinc octoate | 0.02 | 0.02 | 0.02 | — | — | — | — | — | — | — |
| Inorganic filler | SC-2050 | 40 | 40 | 40 | 40 | 40 | 40 | 40 | 40 | 40 | 40 |
| Solvent | toluene | 45 | 45 | 45 | 45 | 45 | 45 | 45 | 45 | 45 | 45 |
|  | butanone | 45 | 45 | 45 | 45 | 45 | 45 | 45 | 45 | 45 | 45 |

TABLE 2

Property analysis results of samples made from the resin compositions
of Examples 11 to 14 and Comparative Examples 1 to 6

| Analysis Item | Unit | E11 | E12 | C1 | E13 | E14 | C2 | C3 | C4 | C5 | C6 |
|---|---|---|---|---|---|---|---|---|---|---|---|
| Thermal resistance T288 | minute | >60 | >60 | 28 | >60 | >60 | >60 | >60 | 31 | 13 | 5 |
| Dissipation factor | no unit | 0.0093 | 0.0087 | 0.0090 | 0.0074 | 0.0077 | 0.0071 | 0.0075 | 0.0085 | 0.0108 | 0.0121 |
| Flame retardance test | no unit | V-0 | V-0 | V-1 | V-1 | V-0 | Burned up | V-2 | V-0 | V-1 | V-0 |

TABLE 3

Components of the resin compositions of Examples 15 to 17 and
Comparative Examples 7 to 12 (unit: part by weight)

| Component Type | Component Name | E15 | C7 | C8 | E16 | E17 | C9 | C10 | C11 | C12 |
|---|---|---|---|---|---|---|---|---|---|---|
| Polyphenylene oxide resin | Example 2 | 100 | — | — | 70 | 50 | — | — | — | — |
|  | SA-90 | — | — | — | — | — | — | — | 100 | — |
|  | OPE-2st | — | 100 | 100 | 30 | 50 | 100 | 100 | — | 100 |
| Cross-linking Agent | Ricon257 | 30 | 30 | 30 | 30 | 30 | 30 | 30 | 30 | 30 |
|  | TAIC | 30 | 30 | 30 | 30 | 30 | 30 | 30 | 30 | 30 |
| Flame retardant | SPB-100 | 24 | 24 | — | 33 | 33 | 33 | 50 | 50 | — |
|  | DOPO-HQ | — | — | 24 | — | — | — | — | — | 65 |
| Bismaleimide | Homide 125 | 10 | 10 | 10 | 10 | 10 | 10 | 10 | 10 | 10 |
| Curing accelerator | 25B | 2 | 2 | 2 | 2 | 2 | 2 | 2 | 2 | 2 |
| Inorganic filler | SC-2050 | 50 | 50 | 50 | 50 | 50 | 50 | 50 | 50 | 50 |
| Solvent | toluene | 100 | 100 | 100 | 100 | 100 | 100 | 100 | 100 | 100 |
|  | butanone | 20 | 20 | 20 | 20 | 20 | 20 | 20 | 20 | 20 |

TABLE 4

Property analysis results of samples made from the resin compositions of
Examples 15 to 16 and Comparative Examples 7 to 12

| Analysis Item | Unit | E15 | C7 | C8 | E16 | E17 | C9 | C10 | C11 | C12 |
|---|---|---|---|---|---|---|---|---|---|---|
| Percent of Thermal expansion | % | 2.92 | 2.92 | unmeasured | 2.98 | 2.97 | unmeasured | 3.75 | unmeasured | unmeasured |
| Thermal resistance T288 | minute | >60 | >60 | 11 | >60 | >60 | >60 | 25 | 1 | 5 |
| Dielectric constant | no unit | 3.95 | 3.94 | 4.03 | 3.97 | 3.97 | 3.97 | 4.07 | 4.12 | 4.15 |
| Dissipation factor | no unit | 0.0070 | 0.0065 | 0.0093 | 0.0068 | 0.0067 | 0.0066 | 0.0075 | 0.0098 | 0.0106 |
| Flame retardance test | no unit | V-0 | V-2 | V-2 | V-0 | V-0 | V-1 | V-0 | Burned up | V-0 |

What is claimed is:

1. A phosphorus-containing polyphenylene oxide resin, comprising a chemical structure represented by the following formula (I):

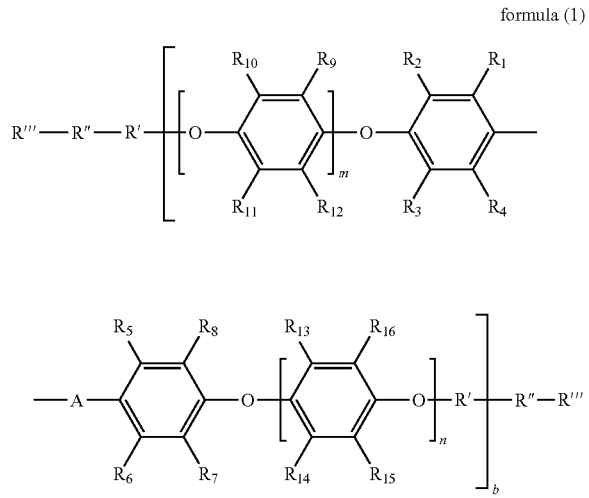

formula (1)

wherein A is selected from a covalent bond, —$CH_2$—, —$CH(CH_3)$—, —$C(CH_3)_2$—, —O—, —S—, —$SO_2$— and carbonyl;
b is a positive integer of 1 to 20;
each of m and n independently represents a positive integer of 1 to 30;
R' is

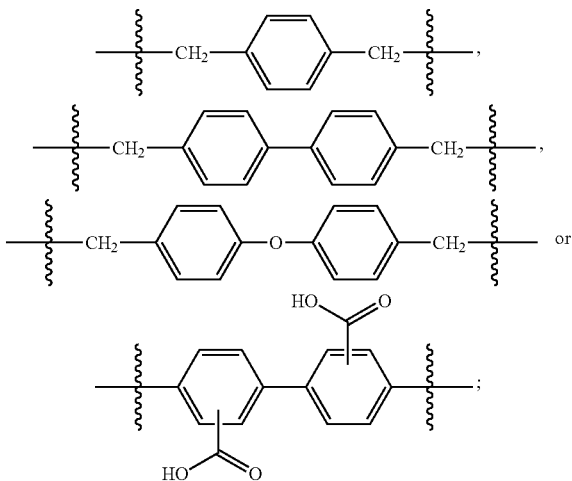

R'' is

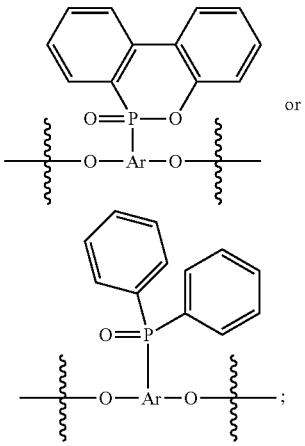

Ar is phenylene, naphthylene or biphenylene;
R''' is hydrogen,

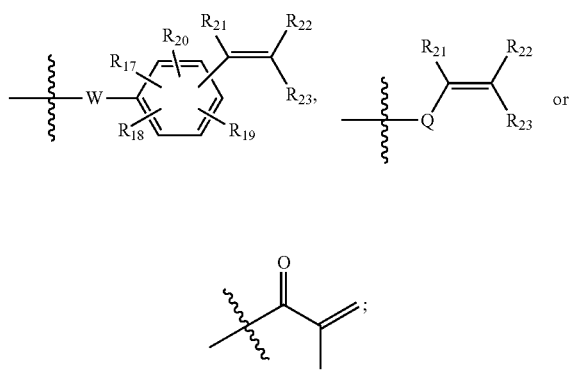

each of Q and W independently represents an aliphatic group;
each of $R_1$ to $R_{23}$ independently represents hydrogen, methyl or halogen.

2. The phosphorus-containing polyphenylene oxide resin of claim 1, wherein A is a covalent bond, —$CH_2$—, —$CH(CH_3)$—, —$C(CH_3)_2$— or carbonyl; b is a positive integer of 1 to 5; each of m and n independently represents a positive integer of 1 to 10; each of Q and W independently represents an aliphatic group having a carbon number of 1 to 3.

3. The phosphorus-containing polyphenylene oxide resin of claim 1, wherein the phosphorus-containing polyphenylene oxide resin is any one of Formula (II) and Formula (III) or a combination thereof:

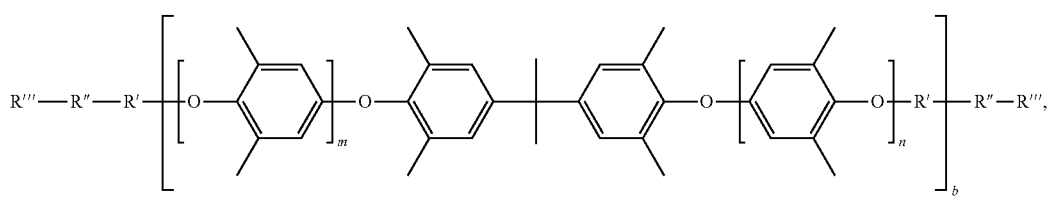

Formula (II)

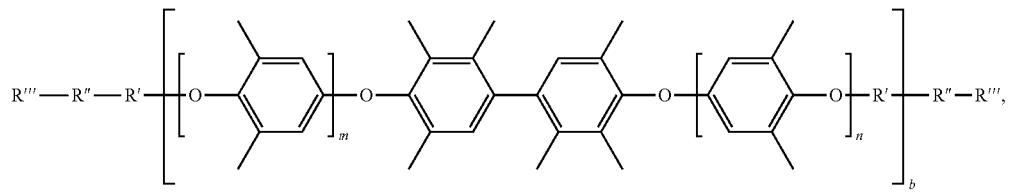
Formula (III)
wherein R' is
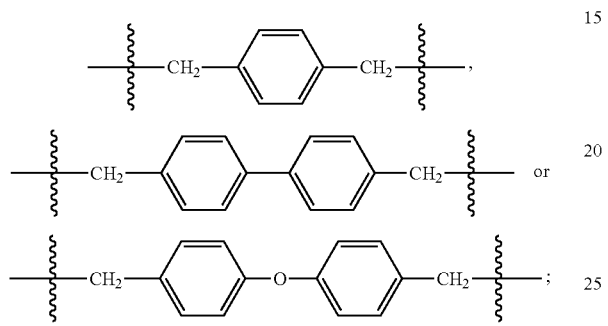
R" is
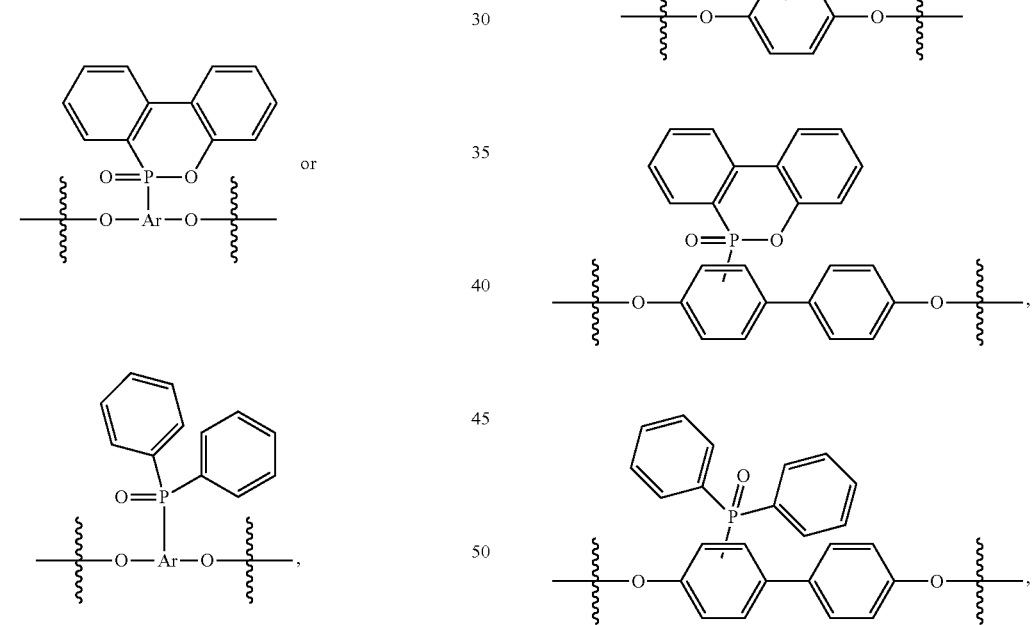
wherein Ar is phenylene, naphthylene or biphenylene;
R''' is hydrogen, 2-propenyl,
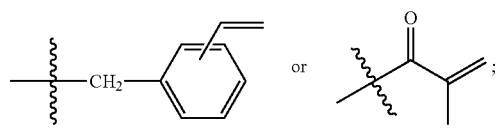
b is a positive integer of 1 to 5; and each of m and n independently represents a positive integer of 1 to 10; and
R" is:
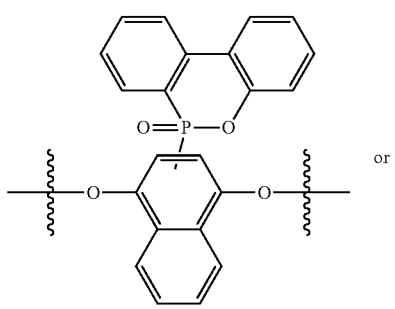

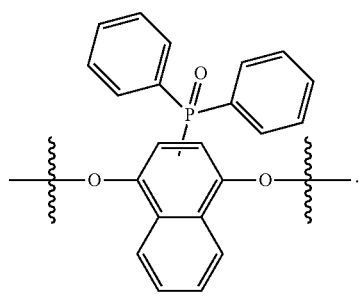
4. The phosphorus-containing polyphenylene oxide resin of claim 1, wherein the phosphorus-containing polyphenylene oxide resin has a chemical structure represented by any one of the following Formula (IV) to Formula (XXX):
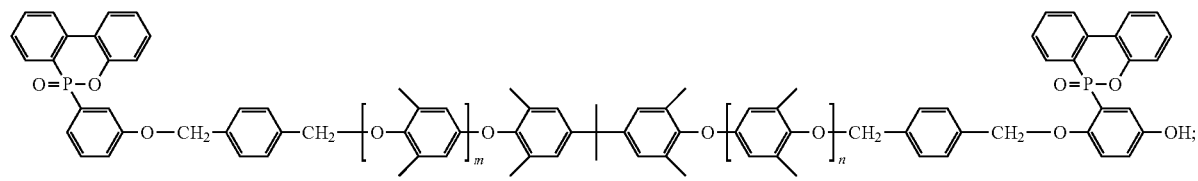
Formula (IV)
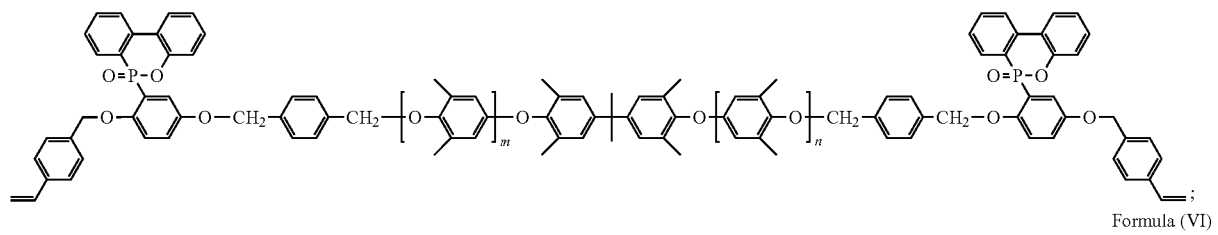
Formula (V)
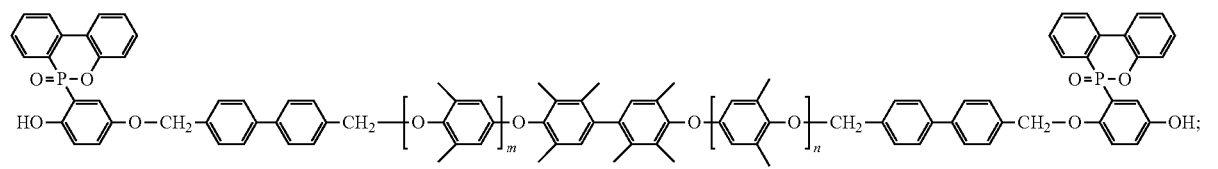
Formula (VI)
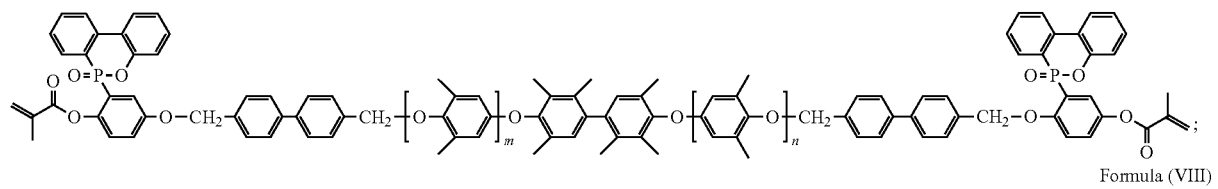
Formula (VII)
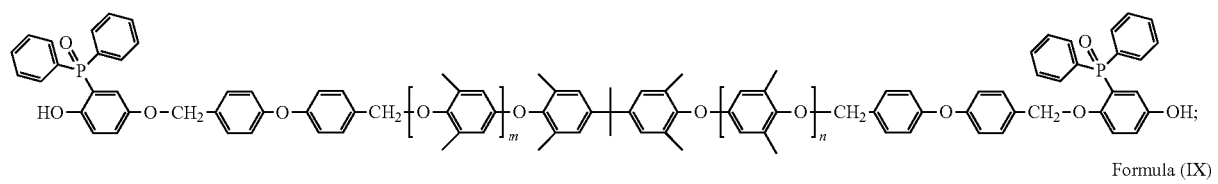
Formula (VIII)
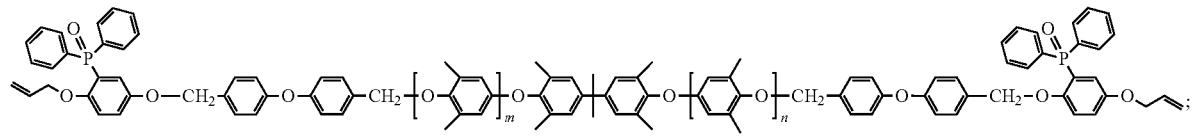
Formula (IX)

Formula (XI)
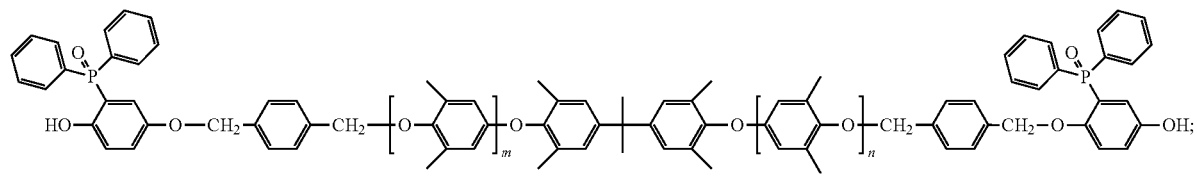
Formula (XII)
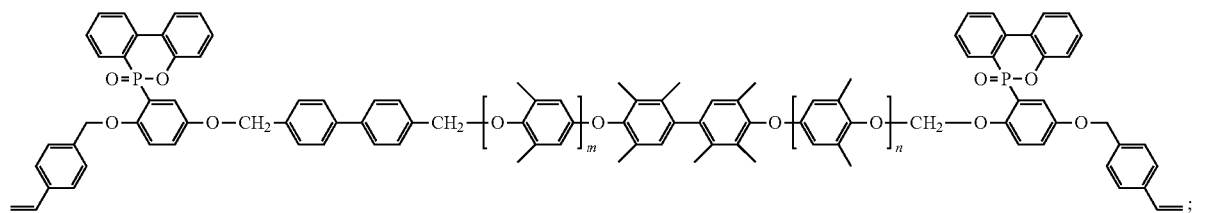
Formula (XIII)
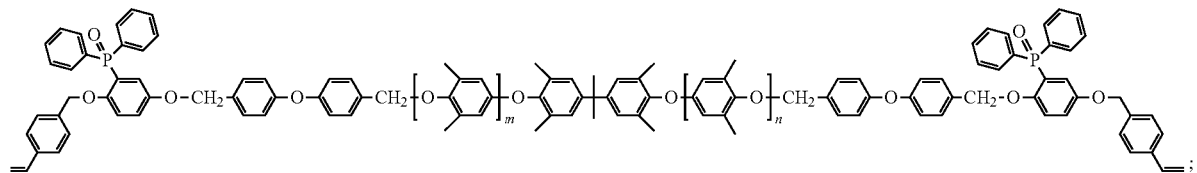
Formula (XIV)
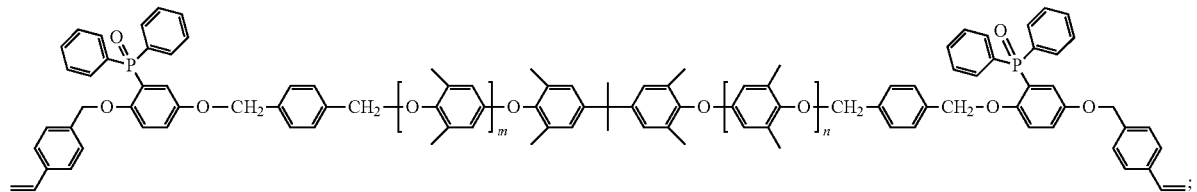
Formula (XV)
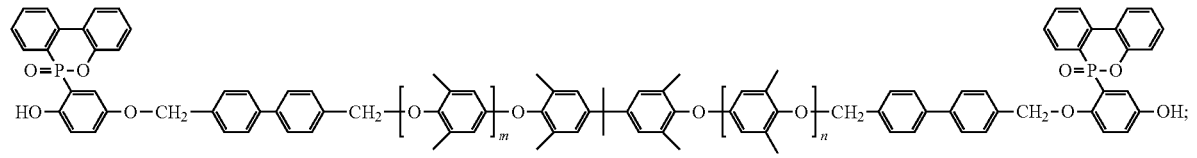
Formula (XVI)
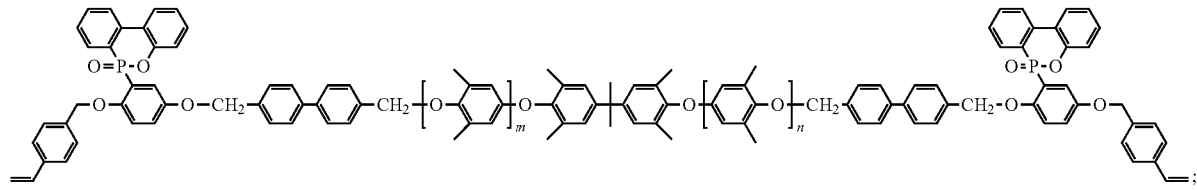
Formula (XVII)
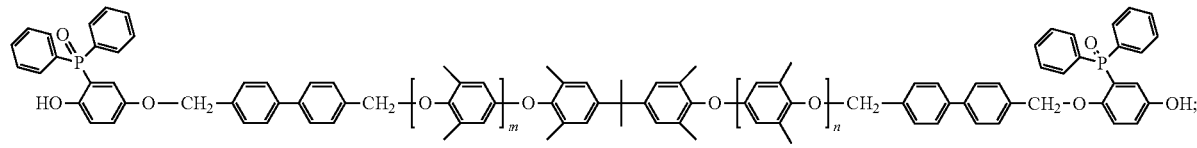

Formula (XVIII)
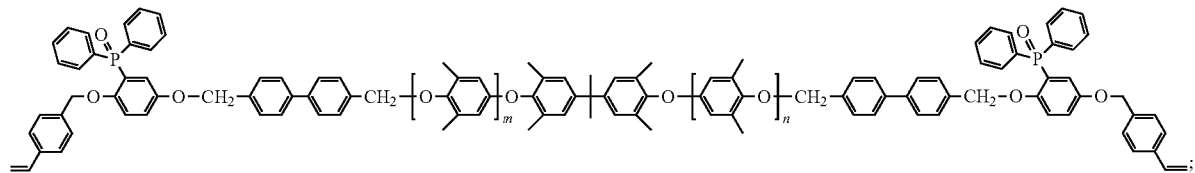
Formula (XIX)
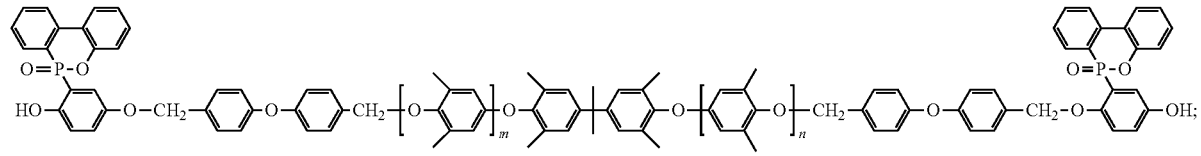
Formula (XX)
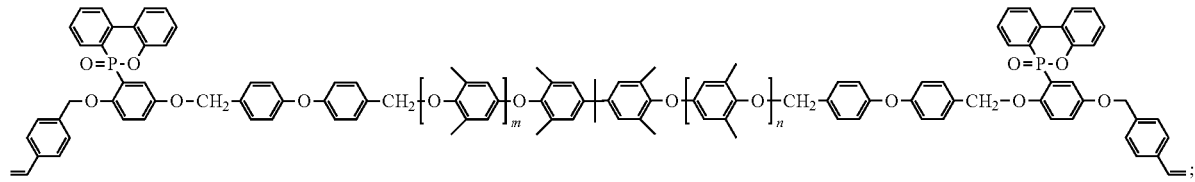
Formula (XXI)
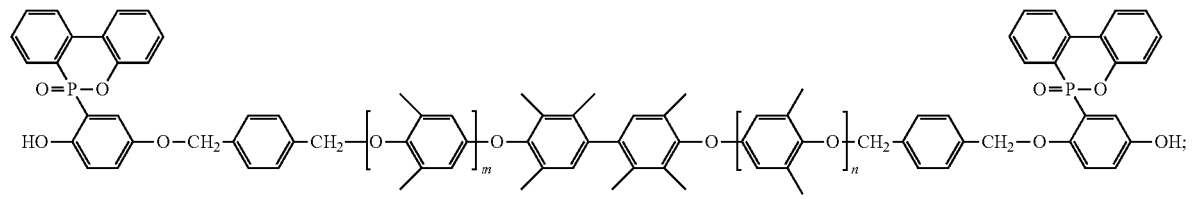
Formula (XXII)
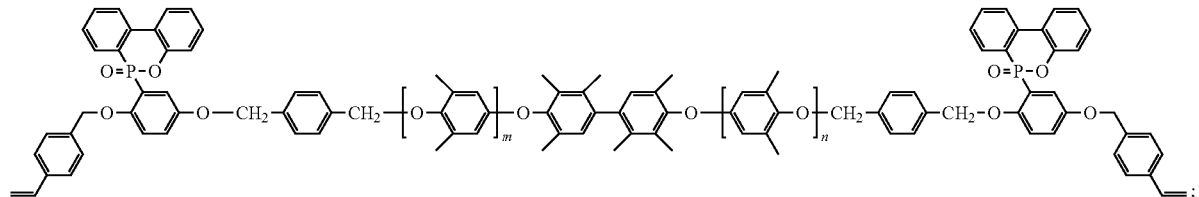
Formula (XXIII)
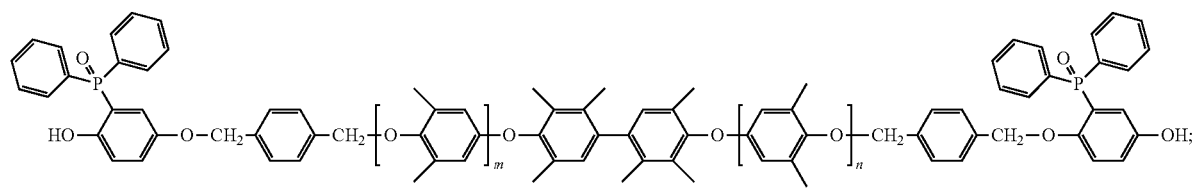
Formula (XXIV)
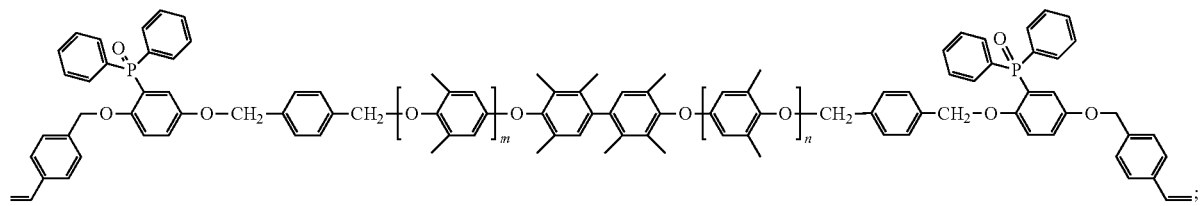

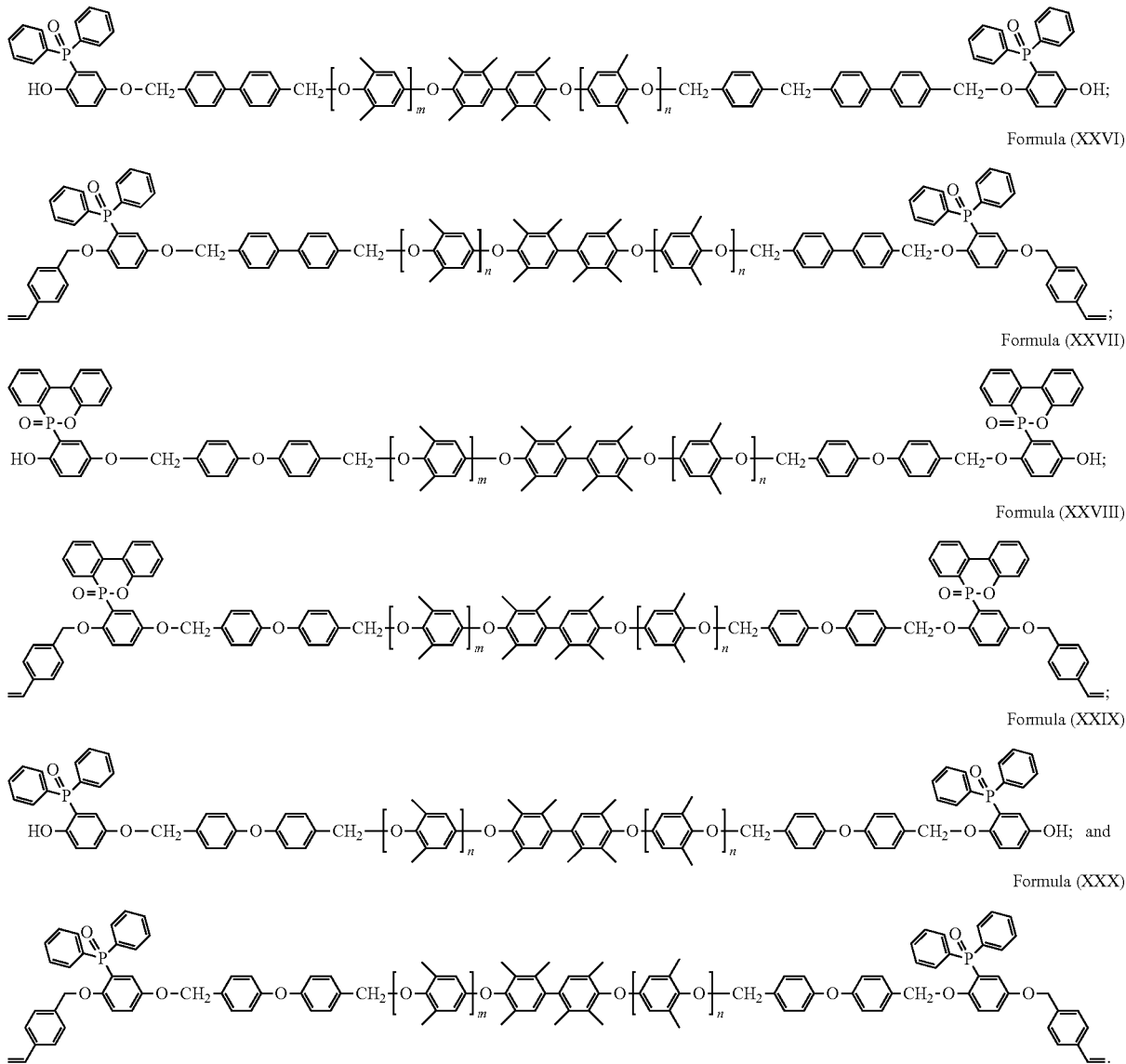

5. A method for preparing a phosphorus-containing polyphenylene oxide resin, comprising:
reacting a di(chloromethyl) compound with dihydroxyl polyphenylene oxide to obtain a first intermediate product; and
reacting the first intermediate product with a phosphorus-containing compound to obtain the phosphorus-containing polyphenylene oxide resin of claim 1.

6. The method of claim 5, wherein the method comprises reacting the di(chloromethyl) compound with dihydroxyl polyphenylene oxide in the presence of a phase transfer catalyst to obtain a first intermediate product, reacting the first intermediate product with a phosphorus-containing compound in an alkaline condition to obtain the phosphorus-containing polyphenylene oxide resin; wherein the di(chloromethyl) compound is di(chloromethyl)benzene, di(chloromethyl) biphenyl, di(chloromethyl)ether or a combination thereof; the phosphorus-containing compound is 2-(10H-9-oxa-10-phospha-1-phenanthryl)hydroquinone phosphorus oxide, 2-(10H-9-oxa-10-phospha-1-phenanthryl)naphthoquinone phosphorus oxide, or 2-(diphenylphosphinyl) hydroquinoneor2-(diphenylphosphinyl)naphthoquinone; the phase transfer catalyst is quaternary ammonium salt or tetrabutyl phosphonium bromide; and wherein based on 1 mole of dihydroxyl polyphenylene oxide, the amount of the di(chloromethyl) compound is greater than 0 mole and smaller than or equivalent to 1 mole; the amount of the phosphorus-containing compound is greater than or equivalent to 1 mole and smaller than or equivalent to 10 moles; and based on 1 mole of dihydroxyl polyphenylene oxide, the amount of the phase transfer catalyst is greater than or equivalent to 0.01 mole and smaller than or equivalent to 1 mole.

7. The method of claim 5, further comprising reacting with a vinyl compound to obtain a vinyl phosphorus-containing polyphenylene oxide resin, wherein based on 1 mole of dihydroxyl polyphenylene oxide, the amount of a vinyl compound is greater than or equivalent to 0.1 mole and smaller than or equivalent to 4 moles.

8. A method for preparing a prepolymer of a phosphorus-containing polyphenylene oxide, comprising mixing the phosphorus-containing polyphenylene oxide resin of claim 1, a double bond-containing compound, peroxide and a solvent to prepare the prepolymer of phosphorus-containing polyphenylene oxide; wherein the double bond-containing compound is isocyanate, isocyanurate, maleimide, polyolefin, divinyl benzene or an acrylic resin.

9. The method of claim 8, wherein the double bond-containing compound is triallyl isocyanurate or styrene-butadiene copolymer, and the peroxide is dibenzylperoxide, 2,5-dimethyl-2,5-di(t-butylperoxy)-3-hexyne, dicumyl peroxide, tert-butyl peroxybenzoate or di(tert-butyl peroxyisopropyl)benzene.

10. A resin composition, comprising:
   a polyphenylene oxide resin comprising the phosphorus-containing polyphenylene oxide resin of claim 1, the prepolymer of phosphorus-containing polyphenylene oxide made from the method of claim 5 or 8 or a combination thereof; and
   an additive comprising a flame retardant, an inorganic filler, polyolefin, a curing accelerator, a solvent, a surfactant, a toughener, cyanate ester, isocyanurate, maleimide or a combination thereof.

11. The resin composition of claim 10, wherein based on 100 parts by weight of polyphenylene oxide resin, an amount of the curing accelerator is between 0.01 part by weight and 5 parts by weight; an amount of the inorganic filler is between 10 parts by weight and 200 parts by weight; an amount of the maleimide is between 10 parts by weight and 100 parts by weight; an amount of the cyanate ester is between 10 parts by weight and 100 parts by weight; an amount of the flame retardant is between 10 parts by weight and 200 parts by weight; an amount of the polyolefin is between 5 parts by weight and 50 parts by weight; an amount of the isocyanurate is between 10 parts by weight and 100 parts by weight.

12. The resin composition of claim 10, further comprising dihydroxyl polyphenylene oxide, a bis(vinylbenzyl) polyphenylene oxide resin, vinyl benzyl etherified modified bisphenol A polyphenylene oxide or a methacrylic polyphenylene oxide resin.

13. An article made from the resin composition of claim 10, wherein the article is a resin film, a prepreg, a laminate or a printed circuit board.

* * * * *